(12) United States Patent
Kijima

(10) Patent No.: US 9,873,948 B2
(45) Date of Patent: Jan. 23, 2018

(54) FEROELECTRIC CERAMICS AND METHOD FOR MANUFACTURING THE SAME

(71) Applicant: YOUTEC CO., LTD., Chiba (JP)

(72) Inventor: Takeshi Kijima, Chiba (JP)

(73) Assignee: YOUTEC CO., LTD., Chiba (JP)

( * ) Notice: Subject to any disclaimer, the term of this patent is extended or adjusted under 35 U.S.C. 154(b) by 267 days.

(21) Appl. No.: 14/824,167

(22) Filed: Aug. 12, 2015

(65) Prior Publication Data
US 2016/0049577 A1    Feb. 18, 2016

(30) Foreign Application Priority Data
Aug. 14, 2014   (JP) ................... 2014-165305

(51) Int. Cl.
| | | |
|---|---|---|
| *B23B 19/00* | (2006.01) | |
| *C23C 28/04* | (2006.01) | |
| *H01L 41/187* | (2006.01) | |
| *H01L 41/08* | (2006.01) | |
| *H01L 41/316* | (2013.01) | |
| *H01L 41/318* | (2013.01) | |
| *H01L 41/319* | (2013.01) | |
| *C23C 14/02* | (2006.01) | |

(Continued)

(52) U.S. Cl.
CPC .......... *C23C 28/042* (2013.01); *C23C 14/025* (2013.01); *C23C 14/088* (2013.01); *C23C 14/5853* (2013.01); *H01L 41/0815* (2013.01); *H01L 41/1876* (2013.01); *H01L 41/316* (2013.01); *H01L 41/318* (2013.01); *H01L 41/319* (2013.01); *H01L 41/0478* (2013.01)

(58) Field of Classification Search
CPC ............... H01L 41/187; H01L 41/1876; H01L 41/0478; H01L 41/316; H01L 41/318; H01L 41/319; H01L 41/0815; C23C 14/08; C23C 14/385; C23C 28/042; C04B 35/491; C04B 35/48
See application file for complete search history.

(56) References Cited

U.S. PATENT DOCUMENTS

2008/0211880 A1 *  9/2008  Hara ................... B41J 2/161
                                                              347/70

FOREIGN PATENT DOCUMENTS

WO        2006/087777         8/2006

OTHER PUBLICATIONS

Takayuki Konya, "X-ray thin-film measurement method Basic lecture the Third High Resolution X-ray Diffraction Method", Technical Note, Application Laboratory, Rigaku Corporation, 2008 (with English translation).

(Continued)

*Primary Examiner* — Shane Fang
(74) *Attorney, Agent, or Firm* — Wenderoth, Lind & Ponack, L.L.P.

(57) ABSTRACT

To enhance piezoelectric property. One aspect of the present invention is ferroelectric ceramics including a $Pb(Zr_{1-x}Ti_x)O_3$ film, wherein: the x satisfies the following formula 1, the $Pb(Zr_{1-x}Ti_x)O_3$ film has a plurality of columnar single crystals, the x axis, the y axis and the z axis of each of the plurality of columnar single crystals are oriented in the same direction, respectively, $$0 < x < 1 \quad \text{formula 1.}$$

20 Claims, 51 Drawing Sheets
(28 of 51 Drawing Sheet(s) Filed in Color)

(51) Int. Cl.
*C23C 14/08* (2006.01)
*C23C 14/58* (2006.01)
*H01L 41/047* (2006.01)

(56) References Cited

OTHER PUBLICATIONS

Yuji Noguchi et al., "Role of Nanosized Particles on Ferroelectric/Piezoelectric Devices and Future Prospect", Special/Front line application of nanoparticle technology, Research center for advanced science and technology, The University of Tokyo, 2013 (with English translation).

* cited by examiner

FIG. 3A  FIG. 3B  FIG. 3C
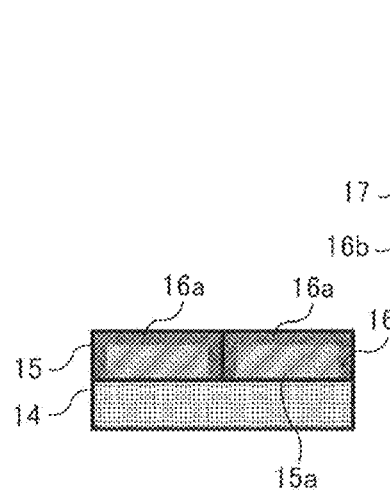
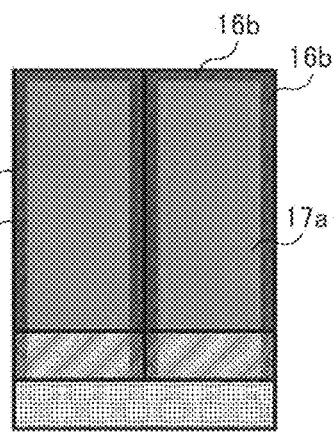
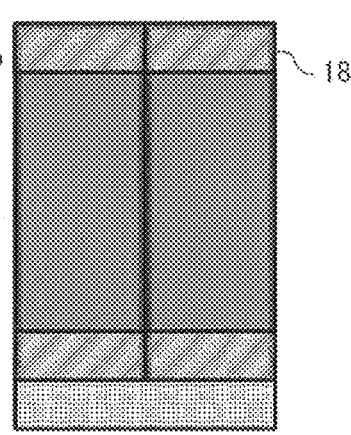
FIG. 4
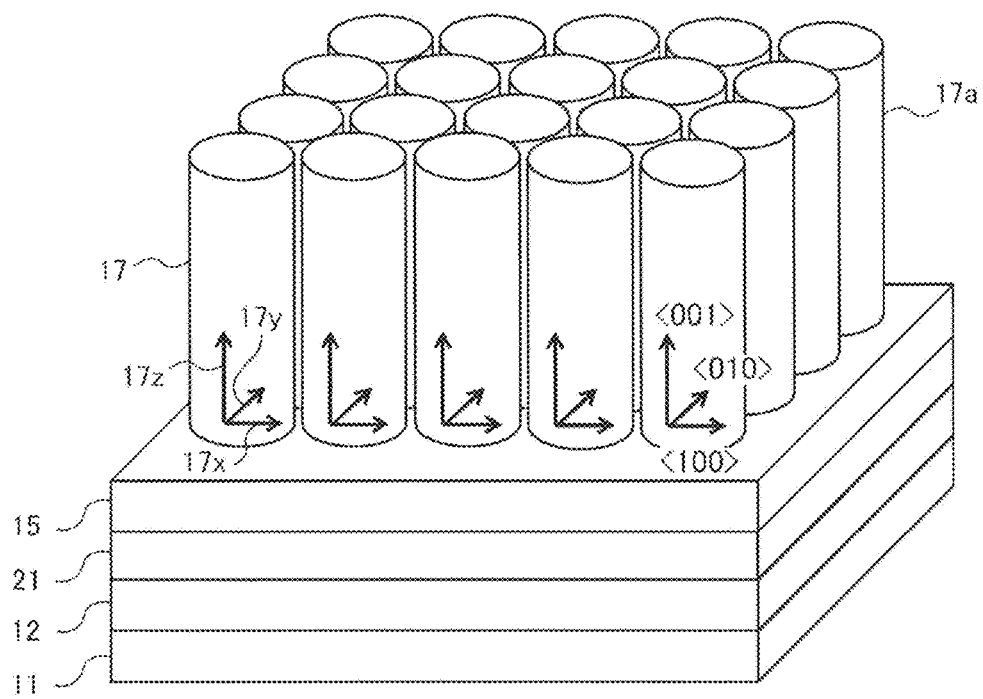

ZrO$_2$(100)/Si(100)

Pt(100)/ZrO$_2$(100)/Si(100)

SRO(100)/Pt(100)/ZrO$_2$(100)/Si(100)

Reciprocal lattice map(image)

Reciprocal lattice vector and reciprocal lattice point of crystal lattice plane (hkl)

Expression by vectors of X ray diffraction condition

Reciprocal lattice simulation

Sample2_phi45 (//Si100)

Sample2_phi45 (//Si100)

There has been confirmed the existence of other domain Pt(111) which is not capable of being evaluated and which is inclined at an angle of about 20°, according to ordinary $\theta - 2\theta$.

The biggest difference between present invention and comparative example
(modeling when wafer is seen from above)

(A) Present invention (B) Comparative Example

Reciprocal lattice mapping (Theory version)

Reciprocal lattice vector and reciprocal lattice point of crystal lattice plane (hkl)

Expression by vectors of X ray diffraction condition

Reciprocal lattice simulation

Sample1_phi0 (//Si110)

Sample1_phi0 (//Si110)

Sample1_phi0 (//Si110)

Sample1_phi0 (//Si110)

0$\bar{0}$4    0$\bar{2}$4    044

0$\bar{8}$2    0$\bar{2}$2    0$\bar{4}$2

Sample1_phi0 (//Si110)

Sample1_phi0 (//Si110)

004    224

113

002    222

111

Sample1_phi0 (//Si110)

Sample1_phi0 (//Si110)

Sample1_phi0 (//Si110)

Sample1_phi0 (//Si110)

Sample1_phi0 (//Si110)

Sample1_phi0 (//Si110)

Sample1_phi45 (//Si100)

Sample1_phi45 (//Si100)

Sample1_phi45 (//Si100)

Sample1_phi45 (//Si100)

Sample1_phi45 (//Si100)

Sample1_phi45 (//Si100)

Sample1_phi45 (//Si100)

Sample1_phi45 (//Si100)

FIG. 89

Sample1_phi45 (//Si100)

Sample1_phi45 (//Si100)

| 004 | -114 | -224 | -334 |
|---|---|---|---|
| + | + | + | + |

| 002 | -112 | -222 | -332 |
|---|---|---|---|
| + | + | + | + |

FIG. 91

Sample1_phi45 (//Si100)

Sample1_phi45 (//Si100)

| 004 | 014 | 024 | 034 |
| × | × | × | × |
| 003 | 013 | 023 | 033 |
| × | × | × | × |
| 002 | 012 | 022 | 032 |
| × | × | × | × |
| 001 | 011 | 021 | 031 |
| × | × | × | × |

Example Sample_phi0 (//Si110)

FEROELECTRIC CERAMICS AND METHOD FOR MANUFACTURING THE SAME

BACKGROUND OF THE INVENTION

Field of the Invention

The present invention relates to ferroelectric ceramics and a method for manufacturing thereof.

Conventional method for manufacturing Pb(Zr, Ti)O$_3$ (hereinafter referred to as "PZT") film will be explained. This PZT film is one example of a perovskite-type ferroelectric ceramics.

A SiO$_2$ film having a thickness of 300 nm is formed on a wafer of Si of 4 inches, and a TiO$_x$ film having a thickness of 5 nm is formed on the SiO$_2$ film. Next, a Pt film having a thickness of 150 nm oriented, for example, in (111) is formed on the TiO$_x$ film, and a PZT sol-gel solution is coated on the Pt film under rotation by a spin coater. The spin condition at this time is a condition of rotation at 1500 rpm for 30 seconds, and then at 4000 rpm for 10 seconds.

Next, the thus coated PZT sol-gel solution is dried by keeping with heating on a hot-plate at 250° C. for 30 seconds to remove water, and further, is pre-calcined by being kept under heating on a hot-plate at a high temperature of 500° C. for 60 seconds. A PZT amorphous film having a thickness of 150 nm is produced by repeating the procedure several times.

Subsequently, annealing treatment at 700° C. is performed on the PZT amorphous film by using a pressurized lamp annealing apparatus (RTA: rapid thermal anneal) to thereby carry out crystallization of PZT. The thus crystallized PZT film has the perovskite structure (refer to, for example, Patent Document 1).

Description of a Related Art
Patent Document
[Patent Document 1] WO2006/087777
[Non-Patent Document 1] Rigaku Journal 39(2)2008, PP10-17 "Technical Note X-Ray measuring method of thin film Basic structure The third high resolution X ray diffraction method Takayuki KONYA"
[Non-Patent Document 2] Hunsai No. 56(2013), pp 38-41 "Special/Front line of application of nano particle technology Role and future advance of nano particles in ferroelectric piezoelectric device Yuji NOGUCHI, Yuki KITANAKA, Masaru MIYAMA"

SUMMARY OF THE INVENTION

Problem to be Solved by the Invention

According to one aspect of the present invention, a problem to be solved is to enhance piezoelectric property.

Solutions to the Problems

Hereinafter, various aspects of the present invention will be explained.

[1] Ferroelectric ceramics including a Pb(Zr$_{1-x}$Ti$_x$)O$_3$ film, wherein:
 the x satisfies the following formula 1,
 the Pb(Zr$_{1-x}$Ti$_x$)O$_3$ film has a plurality of columnar single crystals,
 the x axis, the y axis and the z axis of each of the plurality of columnar single crystals are oriented in the same direction, respectively, $$0 < x < 1 \text{ (Preferably } 0.1 < x < 1) \quad \text{formula 1.}$$

[2] The ferroelectric ceramics according to the above [1], wherein:
 the Pb(Zr$_{1-x}$Ti$_x$)O$_3$ film is formed on a Pb(Zr$_{1-A}$Ti$_A$)O$_3$ film,
 the A and x satisfy the following formula 2 and formula 3, $$0 \leq A \leq 0.1 \quad \text{formula 2}$$

$$A < x \quad \text{formula 3.}$$

[3] The ferroelectric ceramics according to the above [1] or [2], wherein a plane z of said z axis has plane (001).

[4] The ferroelectric ceramics according to any one of the above [1] to [3], wherein said Pb(Zr$_{1-x}$Ti$_x$)O$_3$ film has a ratio of elements of Pb:(Zr$_{1-x}$+Ti$_x$) is (1.4 to 1.1):1, and includes a PbO wall formed around each of said plurality of columnar single crystals.

[5] The ferroelectric ceramics according to any one of the above [1] to [4], wherein said Pb(Zr$_{1-A}$Ti$_A$)O$_3$ film has a ratio of elements of Pb:(Zr$_{1-A}$+Ti$_A$) is (1.4 to 1.1):1, includes a plurality of columnar single crystals, and includes a PbO wall formed around each of the plurality of columnar single crystals.

[6] The ferroelectric ceramics according to any one of the above [1] to [5], wherein:
 a Pb(Zr$_{1-y}$Ti$_y$)O$_3$ film is formed on said Pb(Zr$_{1-x}$Ti$_x$)O$_3$ film, and
 said Pb(Zr$_{1-y}$Ti$_y$)O$_3$ film has a ratio of elements of Pb:(Zr$_{1-y}$+Ti$_y$) is (1.05 to 1):1, and
 said y satisfies the following formula 4, $$0 < y < 1 \quad \text{formula 4.}$$

[7] The ferroelectric ceramics according to the above [6], wherein said ratio of elements of Pb:(Zr$_{1-y}$+Ti$_y$) is 1:1.

[8] The ferroelectric ceramics according to any one of the above [1] to [7], wherein:
 said A is 0, and
 said Pb(Zr$_{1-A}$Ti$_A$)O$_3$ is a PbZrO$_3$ film.

[9] The ferroelectric ceramics according to any one of the above [1] to [8], wherein the Pb(Zr$_{1-A}$Ti$_A$)O$_3$ film is formed on an oxide film.

Note that the oxide film is preferably an oxide of a perovskite structure.

[10] The ferroelectric ceramics according to the above [9], wherein said oxide film is an SrRuO$_3$ (SRO) film or an Sr(Ti,Ru)O$_3$ film.

[11] The ferroelectric ceramics according to any one of the above [1] to [10], wherein said Pb(Zr$_{1-A}$Ti$_A$)O$_3$ film is formed on an electrode film.

[12] The ferroelectric ceramics according to the above [11], wherein said electrode film is made of an oxide or a metal.

[13] The ferroelectric ceramics according to the above [11] or [12], wherein said electrode film is a Pt film or an Ir film.

[14] The ferroelectric ceramics according to any one of the above [11] to [13], wherein said electrode film is formed on a ZrO$_2$ film.

[15] The ferroelectric ceramics according to any one of the above [11] to [14], wherein said electrode film is formed on a Si substrate.

[16] A method for manufacturing ferroelectric ceramics including the steps of:
 forming, on a substrate, a Pb(Zr$_{1-A}$Ti$_A$)O$_3$ film having a plurality of columnar single crystals and a PbO wall formed around each of the plurality of columnar single crystals by coating, onto the substrate, a precursor solution for forming the Pb(Zr$_{1-A}$Ti$_A$)O$_3$ film to which Pb is excessively added by 10 atomic % or more to 40 atomic % or less, and by performing crystallization under a pressurized oxygen atmosphere, and forming, on the $Pb(Zr_{1-A}Ti_A)O_3$ film, a $Pb(Zr_{1-x}Ti_x)O_3$ film including a plurality of columnar single crystals and a PbO wall formed around each of the plurality of columnar single crystals by sputtering a sputtering target for the $Pb(Zr_{1-x}Ti_x)O_3$ having a ratio of elements of $Pb:(Zr_{1-x}+Ti_x)$ being (1.4 to 1.1):1, wherein the A and x satisfy the following formulas 1 to 3, $0<x<1$ (preferably $0.1<x<1$)    formula 1

$0<A<0.1$    formula 2

$A<x$    formula 3.

Note that the substrate also includes, for example, a substrate in which a film is formed on a Si substrate.

[17] A method for manufacturing ferroelectric ceramics including the steps of:

forming, on a substrate, a $Pb(Zr_{1-A}Ti_A)O_3$ film including a plurality of columnar single crystals and a PbO wall formed around each of the plurality of columnar single crystals by coating, onto the substrate, a precursor solution for forming the $Pb(Zr_{1-A}Ti_A)O_3$ film to which Pb is excessively added by 10 atomic % or more to 40 atomic % or less, and by performing crystallization under a pressurized oxygen atmosphere, and forming, on the $Pb(Zr_{1-A}Ti_A)O_3$ film, a $Pb(Zr_{1-x}Ti_x)O_3$ film including a plurality of columnar single crystals and a PbO wall formed around each of the plurality of columnar single crystals by coating, onto the $Pb(Zr_{1-A}Ti_A)O_3$ film, a precursor solution for forming the $Pb(Zr_{1-x}Ti_x)O_3$ film to which Pb is excessively added by 10 atomic % or more to 40 atomic % or less, and by performing crystallization under a pressurized oxygen atmosphere, wherein the A and x satisfy the following formulas 1 to 3, $0<x<1$ (preferably $0.1<x<1$)    formula 1

$0 \leq A \leq 0.1$    formula 2

$A<x$    formula 3.

Note that the substrate also includes, for example, a substrate in which a film is formed on a Si substrate.

[18] The method for manufacturing ferroelectric ceramics according to the above [16] or [17], comprising the step of: after the step of forming said $Pb(Zr_{1-x}Ti_x)O_3$ film, forming a $Pb(Zr_{1-y}Ti_y)O_3$ film on said $Pb(Zr_{1-x}Ti_x)O_3$ film by coating, onto said $Pb(Zr_{1-x}Ti_x)O_3$ film, a precursor solution for forming the $Pb(Zr_{1-y}Ti_y)O_3$ film to which Pb is excessively added by 0 atomic % or more to 5 atomic % or less, and by performing crystallization under a pressurized oxygen atmosphere, wherein said y satisfies the following formula 4, $0<y<1$    formula 4.

[19] The method for manufacturing ferroelectric ceramics according to the above [18], wherein a ratio of elements of said $Pb:(Zr_{1-y}+Ti_y)O_3$ is 1:1.

[20] The method for manufacturing ferroelectric ceramics according to any one of the above [16] to [19], wherein:

said A is 0, and said $Pb(Zr_{1-A}Ti_A)O_3$ is a $PbZrO_3$ film.

In the aforementioned various aspects of the present invention, when the particular C (hereinafter referred to as "C") is formed on (or under) the particular B (hereinafter referred to as "B") (forming C), the present invention is not limited to the case where C is formed directly on (or under) B (forming C), but also includes the case where C is formed via other matter on (or under) B (forming C) within the scope not inhibiting the effects of one aspect of the present invention.

Effects of the Invention

The piezoelectric property can be enhanced by applying one aspect of the present invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 3A to 3C are schematic cross-sectional views explaining the manufacturing method of the ferroelectric ceramics according to one embodiment of the present invention.

FIG. 4 is a schematic cross-sectional view explaining the manufacturing method of the ferroelectric ceramics according to one embodiment of the present invention.

FIG. 63A shows the present example, and FIG. 63B shows the comparative example.

FIG. 89 shows simulation results of the reciprocal lattice of the PZT single crystal.

FIG. 90 shows simulation results of the reciprocal lattice of the PZT single crystal.

FIG. 91 shows simulation results of the reciprocal lattice of the PZT single crystal.

FIG. 92 shows simulation results of the reciprocal lattice of the PZT single crystal.

DESCRIPTION OF THE PREFERRED EMBODIMENTS

Hereinafter, embodiments and Examples of the present invention will be explained in detail using the drawings. However, a person skilled in the art would be able to easily understand that the present invention is not limited to the following explanation, but forms and details thereof can be variously modified without deviating from the purport and the scope of the present invention. Accordingly, the present invention is not to be construed as being limited to description of the embodiments and Examples, shown below.

First Embodiment

Figure 1:
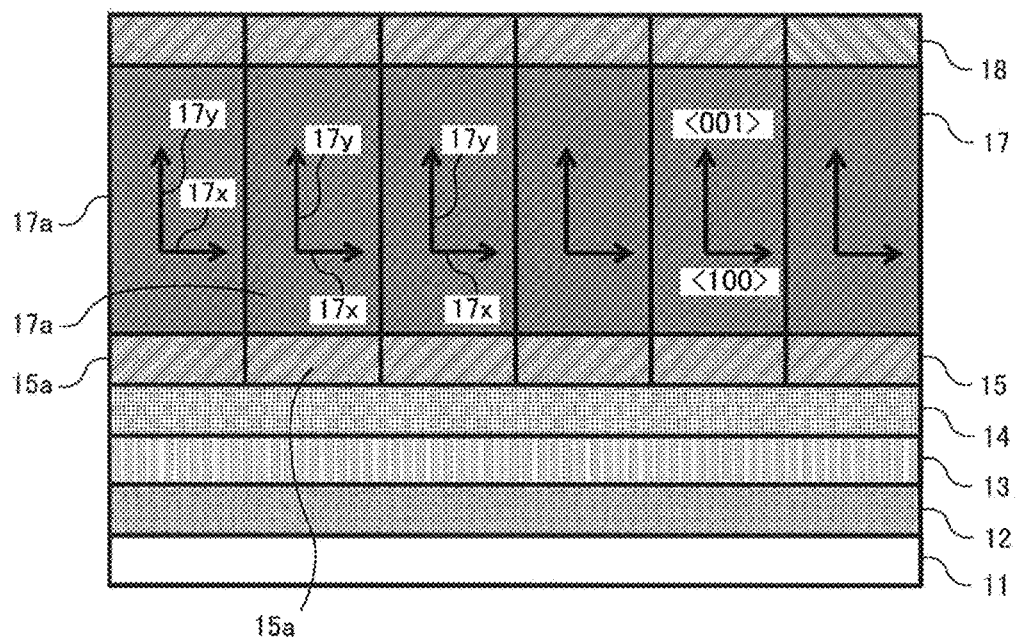
FIG. 1 is a schematic cross-sectional view explaining a manufacturing method of ferroelectric ceramics according to one embodiment of the present invention.
Figure 2:
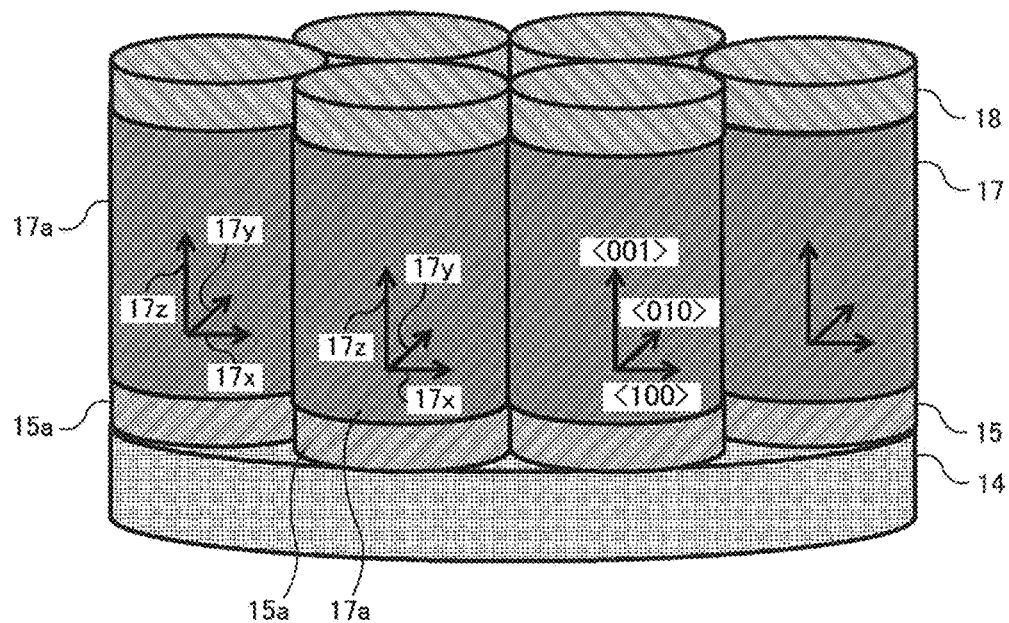
FIG. 2 is a schematic perspective view of the ferroelectric ceramics shown in FIG. 1.

FIGS. 1 to 3 are schematic cross-sectional views explaining the manufacturing method of the ferroelectric ceramics according to one aspect of the present invention. Note that, in FIGS. 2 and 3, a part of films is omitted.

As shown in FIG. 1, a Si substrate 11 which is oriented in (100) is prepared. Note that, although the Si substrate 11 is used in the present embodiment, the substrate is not limited to the Si substrate, and there can be used various substrates, for example, a single crystal substrate such as a Si single crystal or sapphire single crystal, a single crystal substrate in which a metal oxide film is formed on the surface thereof, a substrate in which a polysilicone film or a silicide film is formed on the surface thereof, and the like.

Next, a $ZrO_2$ film 12 is formed on the Si substrate 11 by vapor deposition method at a temperature of 550° C. or less (preferably at a temperature of 500° C.). The $ZrO_2$ film 12 is oriented in (100). Note that, when a $ZrO_2$ film is formed by vapor deposition method at a temperature of 750° C. or more, the obtained $ZrO_2$ film is not oriented in (100).

In the description, orientation in (100) and orientation in (200) and orientation in (400) are substantially the same, and orientation in (001) and orientation in (002) and orientation in (004) are substantially the same.

Thereafter, a lower electrode 13 is formed on the $ZrO_2$ film 12. The lower electrode 13 is formed by an electrode film composed of a metal or an oxide. For example, a Pt film or an Ir film is used as the electrode composed of a metal. The electrode film composed of an oxide is, for example, a $Sr(Ti_{1-x}Ru_x)O_3$ film, in which x satisfied the following formula 5.

$$0.01 \leq x \leq 0.4 \qquad \text{formula 5}$$

According to the present embodiment, a Pt film 13 through epitaxial growth is formed as the lower electrode by sputtering at a temperature of 550° C. or less (preferably at a temperature of 400° C.) on the $ZrO_2$ film 12. The Pt film 13 is oriented in (200).

Next, as shown in FIG. 1 and FIG. 2, a $SrRuO_3$ (SRO) film 14 is formed by sputtering on the Pt film 13. An example of the sputtering condition is as follows.

[Sputtering Condition]
Film-forming pressure: 4 Pa
Substrate temperature at film forming: Normal temperature
Gas at film forming: Ar
Ar flow rate: 30 sccm
RF output: 300 W (13.56 MHz power source)
Film-forming time: 6 minutes (film thickness 50 nm)
Target: $SrRuO_3$ sintered body Thereafter, the SRO film 14 is crystallized by RTA (Rapid Thermal Anneal) under a pressurized oxygen atmosphere. An example of the RTA condition at this time is as follows.

[RTA Condition]
Annealing temperature: 600° C.
Introduction gas: Oxygen gas
Pressure: 9 kg/cm²
Temperature raising rate: 100° C./sec
Annealing time: 5 minutes Subsequently, as shown in FIG. 1, FIG. 2 and FIG. 3A, a $PbZrO_3$ film (hereinafter, also referred to as "PZO film") 15 is formed on the SRO film 14. The PZO film 15 can be formed by the sol gel method. Specifically, a precursor solution for forming the PZO film to which Pb is excessively added by 10 atomic % or more to 40 atomic % or less is coated on the SRO film 14, and is then subjected to heat treatment under a pressurized oxygen atmosphere at a pressure of 5 atm or more (preferably 7.5 atm or more), with the result that the crystallization is carried out. Thereby, while growing a plurality of crystalline particles of the $PbZrO_3$ (PZO) to columnar single crystal 15a, the PbO wall 16a is formed around and in the upper part of the columnar single crystal 15a by extruding the excessive Pb (referring to FIG. 3A). Namely, the PZO film 15 having a plurality of the columnar single crystal 15a and the PbO wall 16a formed around each of the plurality of columnar single crystal 15a are formed on the SRO film 14. The PZO has the longest length along c axis among the PZT-based oxides. A ratio of elements of Pb:Zr of the $PbZrO_3$ film 15 is (1.4 to 1.1):1.

The PZO film 15 has the longest length along c axis among the PZT type, and is used as an initial nuclear for elongating the length of the PZT film thereon along the c axis.

The lattice constants of the PZO are a=8.232 angstroms, b=11.776 angstroms, and c=5.882 angstroms, respectively. The length along the a axis is approximately twice an average length of perovskite (ap≈4 angstroms), the length along the c axis is c≈(√2)ap, the length along the b axis is b≈2c. The change in the lattice constants of the PZO is fundamentally caused by the fact that the cycle along the b axis becomes twice due to the rotation of the octahedral crystal of perovskite and furthermore, due to stress of the octahedral body.

Figure 6:
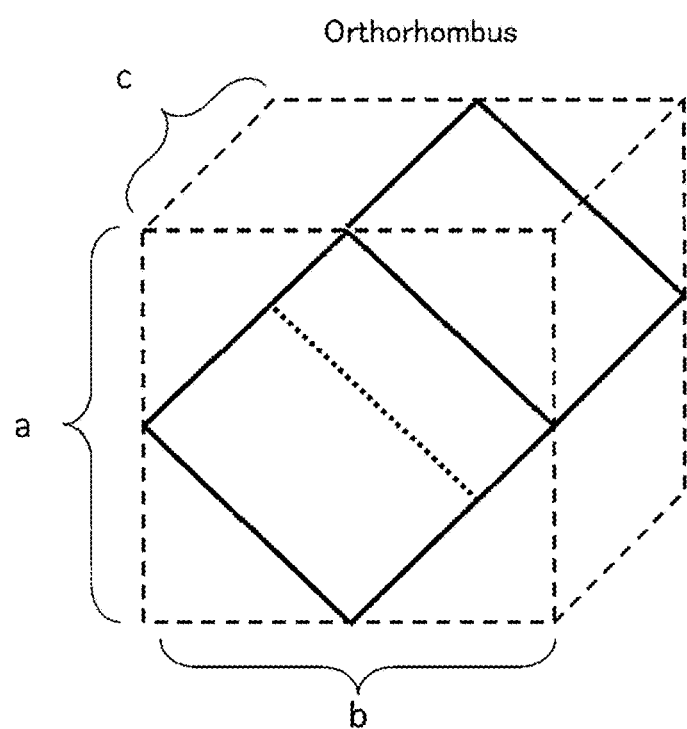
FIG. 6 is a view showing that a crystal structure of PZO is orthorhombus.

As shown in FIG. 6, the PZO is orthorhombus. Accordingly, the PZO has apparently large lattice constants. This is because the perovskite is rotated by approximately 45° in the longitudinal direction and the rotated crystal is handled as if the crystal were a large crystal, with the circumferential portion enclosed by a dotted line. Namely, it is customary that the orthorhombus is handled so that the lengths along the a, b, and c axes are apparently very long. An actual PZO is a crystal shown by a solid line, and is an ordinary perovskite crystal.

Next, a PZT film 17 is formed on the PZO film 15. The PZT film 17 is a $Pb(Zr_{1-x}Ti_x)O_3$ film, and x satisfies the following formula 1, and a ratio of elements of Pb:($Zr_{1-x}$+

Ti$_x$) is (1.4 to 1.1):1. The Pb(Zr$_{1-x}$Ti$_x$)O$_3$ film has a plurality of columnar single crystal 17a, and x axis 17x, y axis 17y and z axis 17z of each of the plurality of columnar single crystal 17a are oriented in the same direction (referring to FIG. 1 and FIG. 2). Note that, in the description, the "same direction" means not only perfectly the same direction but also the direction including deviation within 10% with respect to the same direction. Accordingly, there is formed the epitaxial growth film by the domain structure in which the plurality of columnar single crystal 17a is gathered. The columnar single crystal 17a is constituted of rhombohedral crystal, and the z plane of the z axis 17z of each of the plurality of columnar single crystal 17a has PZT (001) plane. Meanwhile, the z axis means an axis which is vertical to the Si substrate.

$$0<x<1 \text{ (preferably } 0.1<x<1) \quad \text{formula 1}$$

Note that, in the description, the "PZT film" includes a Pb(Zr$_{1-x}$Ti$_x$)O$_3$ which contains impurities, and various impurities may be contained as long as the function of the piezoelectric property of the PZT film is not extinguished even if the impurities are contained. Furthermore, in the description, the "PZO film" includes a PbZrO$_3$ which contains impurities, and various impurities may be contained as long as the function of the PZO is not extinguished even if the impurities are contained.

Note that, hereinafter, a method for forming the PZT film 17 by a sputtering method will be explained.

A sputtering target for the Pb(Zr$_{1-x}$Ti$_x$)O$_3$ having the ratio of elements of Pb:(Zr$_{1-x}$+Ti$_x$) being (1.4 to 1.1):1 is sputtered. Thereby, a plurality of the Pb(Zr$_{1-x}$Ti$_x$)O$_3$ (PZT) crystalline particles continuously grows to a columnar single crystal 17a, on the PZO film 15, along the longest c axis of the PZO, and a PbO wall 16b is formed around and in the upper portion of the columnar single crystal 17a by extruding the excess Pb (refer to FIG. 3B). Namely, there is formed, on the PZO film 15, the PZT film 17 having a plurality of the columnar single crystals 17a and the PbO wall 16b formed around each of the plurality of columnar single crystals 17a. At this time, the PbO wall 16a in the upper part of the PZO film 15 shown in FIG. 3A is diffused into the PZT film 17 (refer to FIG. 3B).

In addition, hereinafter, a method for forming the PZT film 17 by a sol-gel method will be explained.

A precursor solution for forming the PZT film to which Pb is excessively added by 3.0 atomic % or more to 40 atomic % or less is coated on the PZO film 15, and then the crystallization was carried out by subjecting the resultant substance to heat treatment under a pressurized oxygen atmosphere at a pressure of 10 atm or more. Thereby, a plurality of the Pb(Zr$_{1-x}$Ti$_x$)O$_3$ (PZT) crystalline particles continuously grows to a columnar single crystal 17a while dragging the longest c axis of the PZO, and a PbO wall 16b is formed around and in the upper part of the columnar single crystal 17a by extruding the excess Pb (refer to FIG. 3B). Namely, there is formed, on the PZO film 15, the PZT film 17 having a plurality of the columnar single crystals 17a and the PbO wall 16b formed around each of the plurality of columnar single crystals 17a. At this time, the PbO wall 16a in the upper part of the PZO film 15 shown in FIG. 3A is diffused into the PZT film 17 (refer to FIG. 3B).

Next, crystallization is performed by coating, on the PZT film 17, a precursor solution for forming the Pb(Zr$_{1-y}$Ti$_y$)O$_3$ film which has a stoichiometric composition or to which Pb is excessively added by 0 atomic % or more to 5 atomic % or less, and by heat-treating the resultant substance under a pressurized oxygen atmosphere. At this time, the excess lead in the PbO films 16a and 16b which are the lead-excess wall/plane of the PZT film 17 and the PZO film 15 is used for promoting the crystallization. Thereby, the PZTCap film 18 is formed on the PZT film 17, and the PbO films 16a and 16b are absorbed into the PZTCap film 18, and thus the excess lead in the PZT film 17 and the PZO film 15 is alleviated. The PZTCap film 18 is a Pb(Zr$_{1-y}$Ti$_y$)O$_3$ film, and the y satisfies the following formula 4. The Pb(Zr$_{1-y}$Ti$_y$)O$_3$ film has a ratio of elements of Pb:(Zr$_{1-y}$+Ti$_y$) of (1.05 to 1):1.

$$0<y<1 \quad \text{formula 4.}$$

As described above, the reason why the SRO film is formed on the Pt film, and the PZO film and the PZT film are formed on the SRO film, is as follows. Although the PZT is hard to be crystallized directly on the Pt, the SRO is compatible with the Pt and is easily grown even directly on the Pt, and the PZT is easily grown on the SRO.

The PZT film 17 and the PZTCap film 18 preferably have a Pb-excessive composition of 120 to 130% in 90% or more the whole volume of the films, and are composed of the Zr-excessive rhombohedral crystal region PZT rather than MPB. Lowering of the crystallization temperature and enhancement of crystallization are promoted by the Pb-excessive composition of 120 to 130%, and, at the same time, the columnar crystal group is obtained and each of the PZT crystal columns becomes a single crystal, by covering a periphery of the crystal with the excess PbO.

An excess lead component is collected at the top portion of the film due to a high vapor pressure of lead to form PbO, and thus there is a case where the piezoelectric property (particularly leak current property) is deteriorated. However, according to the present embodiment, the PZT which has a stoichiometric composition or to which Pb is excessively added by 0 atomic % or more to 5 atomic % or less is formed as the top layer PZTCap film 18, and the excess lead component is removed by the use and by the crystallization of the component, with the result that the deterioration of the piezoelectric property can be suppressed.

Note that, even if the excess lead of the PbO films 16a and 16b of the PZT film 17 and the PZO film 15 cannot be sufficiently removed by the PZTCap film 18, and the PbO column cloth (PbO film) remains on the PZT film 17 and the PZO film 15, the fact is not directly involved in the piezoelectric property. The reason is because, since the PZT has a high dielectric constant and the PbO has a low dielectric constant, it is considered that the electric field is concentrated on the PZT having a high dielectric constant when a voltage is applied to the PZT film 17, and the existence of the PbO having a low dielectric constant, which is formed in the same direction as in the direction in which the voltage is applied, is not so much involved in the piezoelectric property.

According to the present embodiment, the entire PZT is influenced by the crystal axis of the initial nucleas of the PZO, by using the PZO film 15 having the longest c axis as an initial nuclear layer (i.e. buffer layer) of the PZT film 17, and thus the crystal axis is easily elongated in the entire PZT film. As a result, the PZT crystalline particles having an excess Pb continuously grow to a columnar single crystal 17a while dragging the longest c axis of the PZO. Therefore, it is possible to orient the x axis 17x, y axis 17y and z axis 17z of each of the plurality of columnar single crystals 17a of the PZT film 17 in the same direction. Accordingly, the piezoelectric property of the PZT film 17 can be enhanced.

Note that, in the present embodiment, the PZO film 15 having a Ti ratio of 0 in the phase diagram of the Pb(Zr, Ti)O$_3$, is formed on the SRO film 14, and the Pb(Zr$_{1-x}$Ti$_x$)O$_3$ ($0<x<1$ ... formula 1) film 17 is formed on the PZO film 15, but the $Pb(Zr_{1-x}Ti_x)O_3$ film may be formed on the $Pb(Zr_{1-A}Ti_A)O_3$ film having a very small Ti ratio. Provided that, A and x satisfy the following formula 1 to formula 3. The $Pb(Zr_{1-A}Ti_A)O_3$ film has a ratio of elements of $Pb:(Zr_{1-A}+Ti_A)$ being (1.4 to 1.1):1. The $Pb(Zr_{1-x}Ti_x)O_3$ film is oriented in (001).

$0<x<1$ (preferably $0.1<x<1$)      formula 1

$0 \leq A \leq 0.1$      formula 2

$A<x$      formula 3.

When the above-described formula 1 is satisfied, that is, when the Ti ratio is 10% or less, the $Pb(Zr_{1-A}Ti_A)O_3$ film to be used as an initial nucleus becomes a PZT of anti-ferroelectric orthorhombus phase (namely, in the phase diagram of the Pb(Zr, Ti)$O_3$, the PZT of the orthorhombus region (ortho region)), and the $Pb(Zr_{1-A}Ti_A)O_3$ acts in the direction of elongating the c axis of all the $Pb(Zr_{1-x}Ti_x)O_3$ (PZT), with the result that the same effects as in the above embodiment can be obtained.

Second Embodiment

Figure 5:
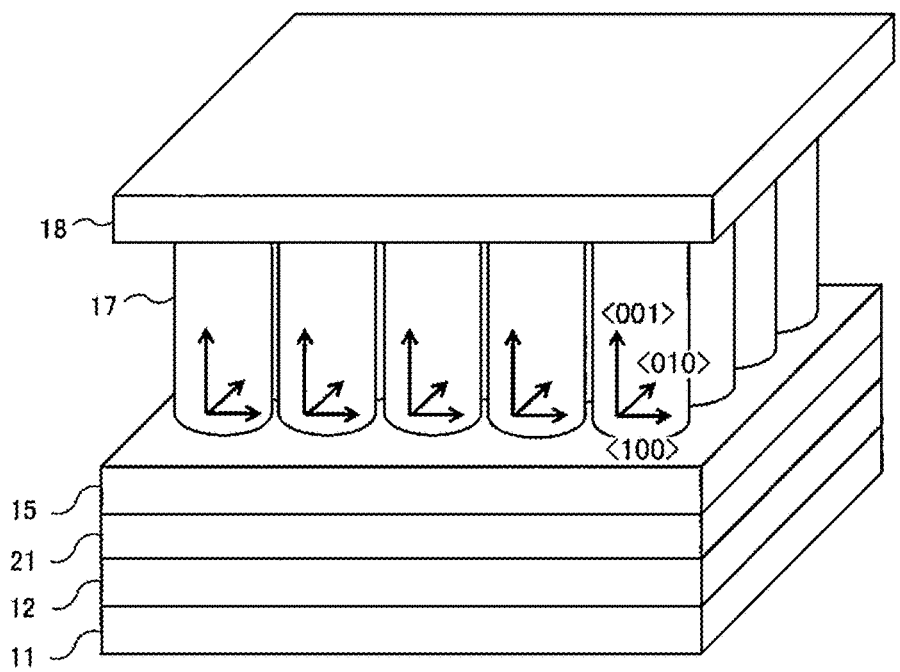
FIG. 5 is a schematic cross-sectional view explaining the manufacturing method of the ferroelectric ceramics according to one embodiment of the present invention.

FIG. 4 and FIG. 5 are schematic cross-sectional views explaining the manufacturing method of the ferroelectric ceramics according to one embodiment of the present invention, and the same symbols are attached to the same parts as in FIG. 1 and FIG. 2.

Since the Si substrate 11, the $ZrO_2$ film 12 is produced in the same way as in the first embodiment, the explanation thereof is omitted.

Next, an oxide film as the lower electrode is formed on the $ZrO_2$ film 12. The oxide film may be preferably an oxide having the perovskite structure, and is a $Sr(Ti,Ru)O_3$ film 21 according to the present embodiment. The $Sr(Ti,Ru)O_3$ film 21 is a $Sr(Ti_{1-x}Ru_x)O_3$ film in which x satisfies the following formula 4', and is formed by the sputtering method. A sintered body of the $Sr(Ti_{1-x}Ru_x)O_3$ is used as a sputtering target. Provided that x satisfies the following formula 4'.

$0.01 \leq x \leq 0.4$ (preferably $0.05 \leq x \leq 0.2$)      formula 4'

Note that the reason why x of the $Sr(Ti_{1-x}Ru_x)O_3$ film 21 is 0.4 or less is that when x is larger than 0.4, the $Sr(Ti_{1-x}Ru_x)O_3$ film is powdered to thereby be not solidified enough.

Thereafter, the $Sr(Ti_{1-x}Ru_x)O_3$ film 21 is crystallized by the RTA (Rapid Thermal Anneal) under a pressurized oxygen atmosphere. The $Sr(Ti_{1-x}Ru_x)O_3$ film 21 is a composite oxide of strontium and titanium and ruthenium, and is a compound having the perovskite structure. The $Sr(Ti,Ru)O_3$ film 21 is oriented in (100).

Subsequently, the PZO film 15 which is oriented in (100) is formed on the $Sr(Ti,Ru)O_3$ film 21 in the same way as in the first embodiment. Then, the PZT film 17 is formed on the PZO film 15 in the same way as in the first embodiment. The PZT film 17 is oriented in (001). After that, the $Pb(Zr_{1-y}Ti_y)O_3$ film 18 ($0<y<1$ ... formula 4) which is oriented in (100) is formed on the PZT film 17 in the same way as in the first embodiment. The $Pb(Zr_{1-y}Ti_y)O_3$ film 18 has a ratio of elements of $Pb:(Zr_{1-y}+Ti_y)O_3$ is (1.05 to 1):1.

In the present embodiment, the same effects as those in the first embodiment can be obtained.

In the present embodiment, the PZT film 17 is formed on the PZO film 15, and the $Pb(Zr_{1-x}Ti_x)O_3$ film may be formed on the $Pb(Zr_{1-A}Ti_A)O_3$ film having a very small Ti ratio. Provided that, A and x satisfy the following formula 1 to formula 3. The $Pb(Zr_{1-x}Ti_x)O_3$ film is oriented in (001).

$0<x<1$ (preferably $0.1<x<1$)      formula 1

$0 \leq A \leq 0.1$      formula 2

$A<x$      formula 3.

The same effects as those in the first embodiment can be obtained by satisfying the above-described formula.

Note that the aforementioned first and second embodiments may be optionally combined to be carried out.

Example 1

Hereinafter, the manufacturing method of the sample according to Example 1 is explained. The film configuration of the sample is the same as in FIG. 1.

A $ZrO_2$ film was formed on a Si substrate of 6 inches having a crystal plane (100) by a vapor deposition method. The vapor deposition condition is as shown in Table 1. The $ZrO_2$ film was oriented in (100).

Subsequently, a Pt film having a thickness of 100 nm was formed on the $ZrO_2$ film by sputtering. The film forming condition is as shown in Table 1. The Pt film was oriented in (100).

TABLE 1

| | Example | |
|---|---|---|
| | Process | |
| | Vapor deposition | DC-sputtering |
| Depo Vac | 6.90E−03 | 3.20E−02 |
| Depo Source | Zr + O2 | Pt |
| ACC/Emission | 7.5 kV/1.50 mA | DC/100 W |
| Total Thickness (nm) | 13.4 | 100 |
| Depo Time (sec) | 930 | 720 |
| SV deg (Tsub) | 500° C. | 400° C. |
| MFC O2 | 5 sccm | Ar: 16 sccm |

Next, a $SrRuO_3$ (SRO) film was formed on the Pt film by sputtering. The sputtering condition is as shown in the followings.

[Sputtering Condition]
Film-forming pressure: 4 Pa
Substrate temperature at film forming: Normal temperature
Gas at film forming: Ar
Ar flow rate: 30 sccm
RF output: 300 W (13.56 MHz power source)
Film-forming time: 6 minutes (film thickness 50 nm)
Target: $SrRuO_3$ sintered body Thereafter, the SRO film is crystallized by RTA under a pressurized oxygen atmosphere. The RTA condition is as follows.

[RTA Condition]
Annealing temperature: 600° C.
Introduction gas: Oxygen gas
Pressure: 9 kg/cm$^2$
Temperature raising rate: 100° C./sec
Annealing time: 5 minutes Next, a precursor solution for forming a $PbZrO_3$ film containing 30% excess lead was coated on the SRO film. Specifically, a raw solution was obtained by mixing a 1.4 mol/kg concentration of a MOD solution for forming 1.3$PbZrO_3$ (Lot. 00050667-1 manufactured by TOYOSHIMA SEISAKUSHO), ethanol and 2n butoxyethanol to be 1000 ml (mixing ratio of 1:1:1, respectively), and adding thereto 20 g of a white powder of polyvinyl pyrrolidone (K-30 manufactured by NIPPON SHOKUBAI), and then dissolving the resultant substance under stirring.

Then, crystallization was performed by heat treatment at 600° C. for 3 minutes, under a pressurized oxygen atmosphere of 10 atm. Thereby, a $PbZrO_3$ film (PZO film) having a thickness of 40 nm was formed on the SRO film.

Subsequently, a PZT film having a thickness of 4 μm was formed on the PZO film by sputtering method. The sputtering condition at this time is as follows.

Figure 7A:
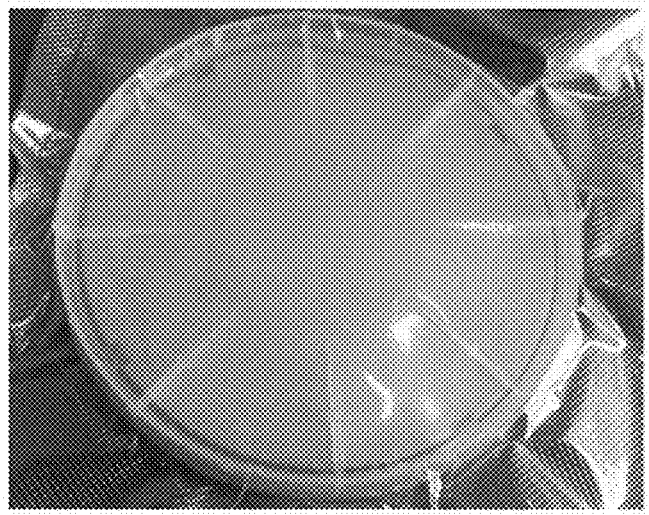
FIG. 7A is a photograph obtained by, after forming a PZT film having a thickness of 4 μm, photographing thus obtained PZT film under sun light.
Figure 7B:
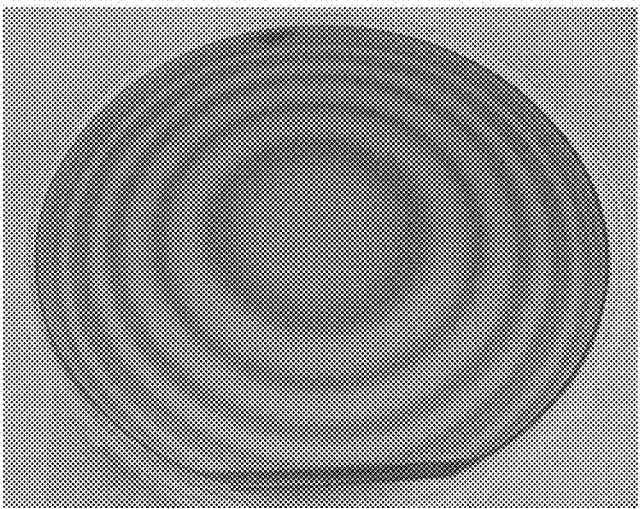
FIG. 7B is a photograph obtained by photographing thus obtained PZT film under the fluorescent light in the clean room.

[Sputtering Condition]
 Apparatus: RF magnetron sputtering apparatus
 PZT target: 130% Excess lead, Zr/Ti=58/42 (Pb$(Zr_{0.58}Ti_{0.42})O_3$)
 Power: 1500 W
 Gas: $Ar/O_2$
 Ratio of $Ar/O_2$: 6.28
 Pressure: 0.14 Pa
 Temperature: 600° C.
 Film-forming rate: 0.63 nm/sec
 Film-forming time: 106 minutes When observing the above-described PZT film just after forming the PZT film having a thickness of 4 μm under sunlight, the film was transparent as shown in FIG. 7A, but under a fluorescent light in a clean room, Newton's rings were observed as shown in FIG. 7B by reflecting λ=632.8 nm which is a main wavelength of the fluorescent light. It was found that the PZT film was dense, smooth, had a high density, and was transparent.

Figure 8:
FIG. 8 is a SEM photograph showing a cross-section image of a film when the PZTCap film having a thickness of 100 nm is formed on the PZT film.

Next, a precursor solution for forming a $Pb(Zr_{0.7}Ti_{0.3})O_3$ film without excess lead was coated on the PZT film. Subsequently, under a pressurized oxygen atmosphere of 10 atm, crystallization was performed by heat treatment at 600° C. for 3 minutes. Thereby, a PZTCap film having a thickness of 100 nm was formed on the PZT film. The cross-sectional view of the film is columnar as shown in the SEM photograph of FIG. 8.

As Comparative Example 1, a sample without having the PZTCap film was produced in the same way as in Example 1. The sample of Comparative Example 1 is the same as in Example 1 except that the PZTCap film is not present.

Figure 9A:
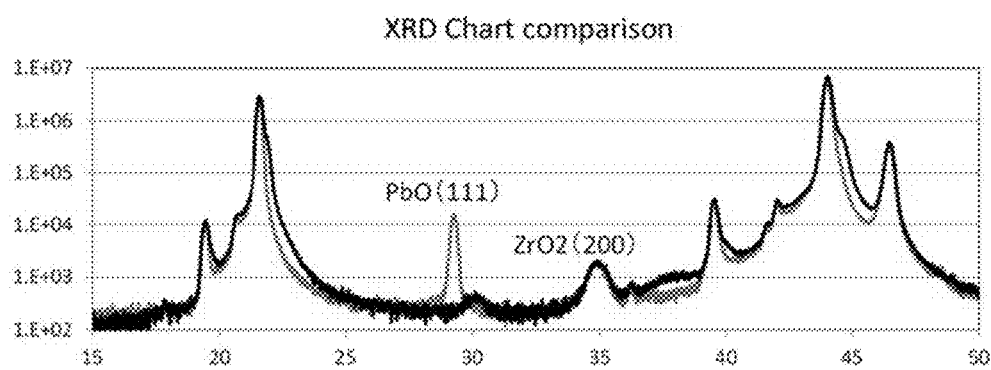
FIGS. 9A and 9B are XRD charts of a sample of Example 1 and a sample of Comparative Example 1, respectively.
Figure 9B:
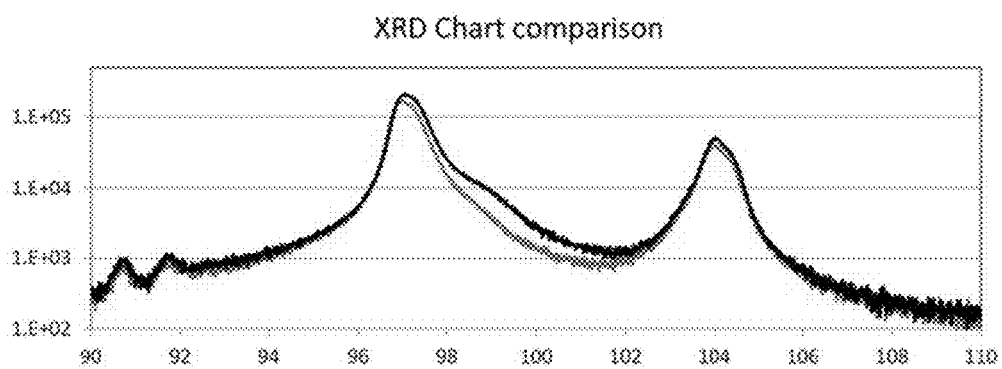

The XRD charts of the sample of Example 1 and the sample of Comparative Example 1 were shown in FIG. 9. By making a comparison between the XRD charts shown in FIGS. 9A and 9B, it is found that, when the PZTCap film was not present, a PbO peak due to the excess lead is observed as shown in FIG. 9A, but when the PZTCap film is formed thereon, the PbO peak has completely disappeared.

Example 2

In Example 2, it was confirmed that the PbO peak disappeared by producing a sample obtained by changing the flow rate of Ar and the flow rate of $O_2$ of the sputtering condition of the PZT film in the manufacturing method of the sample of Example 1.

Figure 10:
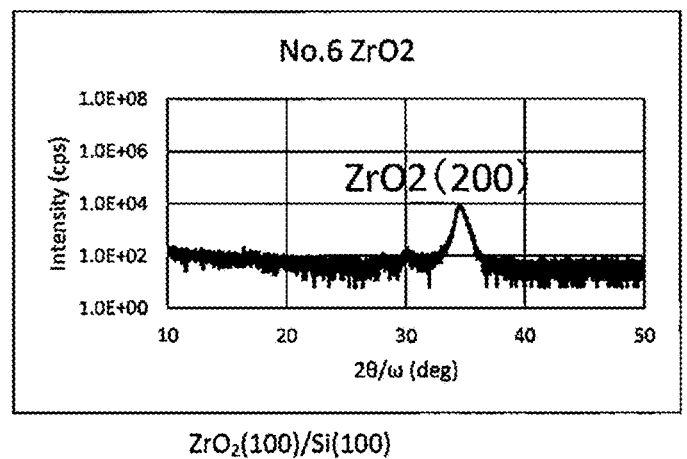
FIG. 10 is an XRD chart of a sample of Example 2.
Figure 10:
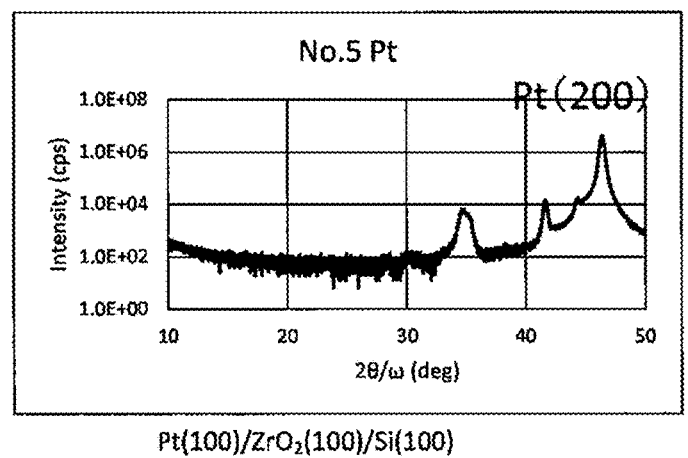
Figure 10:
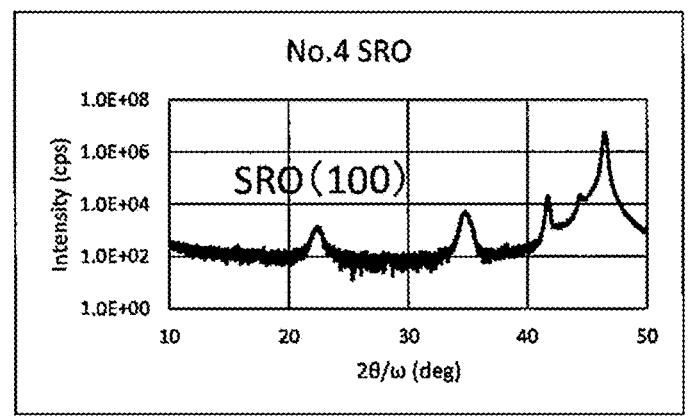
Figure 11:
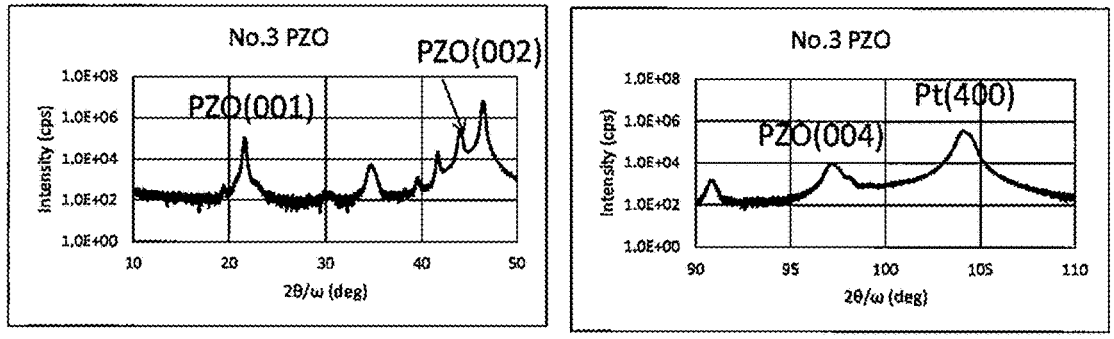
FIG. 11 is an XRD chart of the sample of Example 2.
Figure 11:
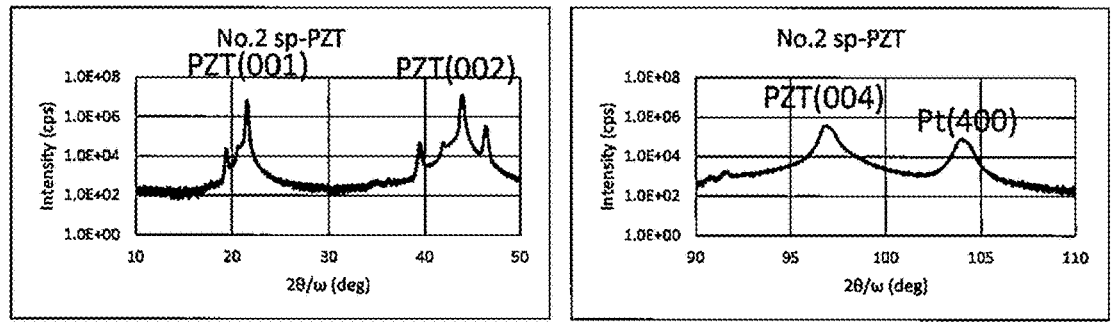
Figure 11:
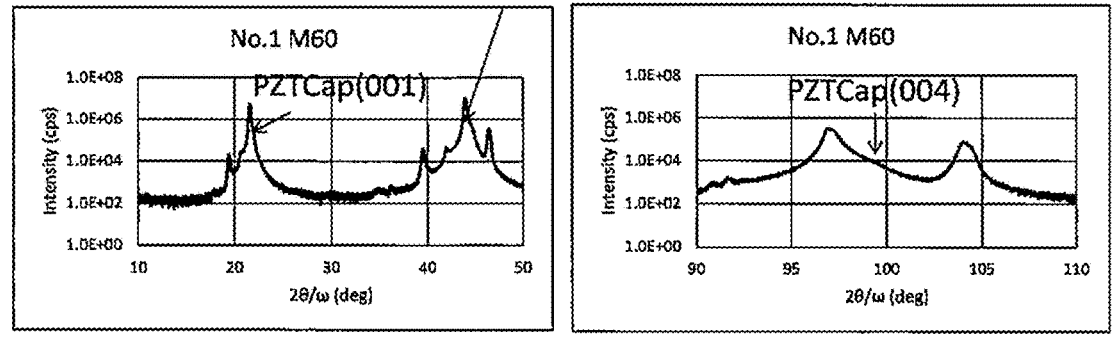

When the initial thickness of 2 μm of the PZT film was formed at a ratio of $Ar/O_2$=6.28, and subsequently, the remaining thickness of 2 μm was formed at a ratio of $Ar/O_2$=2.2, it was able to be confirmed that the PbO peak disappeared in the PZT film formation stage even without forming the PZTCap film, as shown in FIG. 10 and FIG. 11.

Example 3

The film structure and manufacturing method of Sample 1 are as follows, and the same films as those in Example 1 are manufactured by the same manufacturing methods.

40 nm stoichiometry PZT (Zr/Ti=60/40) sol-gel film/4 μm PZT (Zr/Ti=55/45) sputtering film/40 nm PZO sol-gel film/15 nm SRO sputtering film/150 nm Pt sputtering film/15 nm $ZrO_2$ vapor deposition film/Si (100) single crystal substrate The film structure and manufacturing method of Sample 2 are as follows, and the same films as those in Example 1 are manufactured by the same manufacturing methods.

4 μm PZT (Zr/Ti=55/45) sputtering film/40 nm PZO sol-gel film/15 nm SRO sputtering film/150 nm Pt sputtering film/15 nm $ZrO_2$ vapor deposition film/Si (100) single crystal substrate The film structure and manufacturing method of Sample 3 are as follows, and the same films as those in Example 1 are manufactured by the same manufacturing methods.

40 nm PZO sol-gel film/15 nm SRO sputtering film/150 nm Pt sputtering film/15 nm $ZrO_2$ vapor deposition film/Si (100) single crystal substrate The film structure and manufacturing method of Sample 4 are as follows, and the same films as those in Example 1 are manufactured by the same manufacturing methods.

15 nm SRO sputtering film/150 nm Pt sputtering film/15 nm $ZrO_2$ vapor deposition film/Si (100) single crystal substrate The film structure and manufacturing method of Sample 5 are as follows, and the same films as those in Example 1 are manufactured by the same manufacturing methods. Sample 5 is obtained in the same way as in Sample 2 by forming a 15 nm $ZrO_2$ vapor deposition film on a Si (100) single crystal substrate, and after forming the following films thereon, removing, by grinding, the 15 nm $ZrO_2$ vapor deposition film/Si (100) single crystal substrate.

2 μm PZT (Zr/Ti=55/45) sputtering film/40 nm PZO sol-gel film/15 nm SRO sputtering film/150 nm Pt sputtering film The film structure and manufacturing method of Sample 6 are as follows, and the same films as those in Example 1 are manufactured by the same manufacturing methods. Sample 6 is obtained by removing the 150 nm Pt sputtering film of Sample 5.

Figure 12:
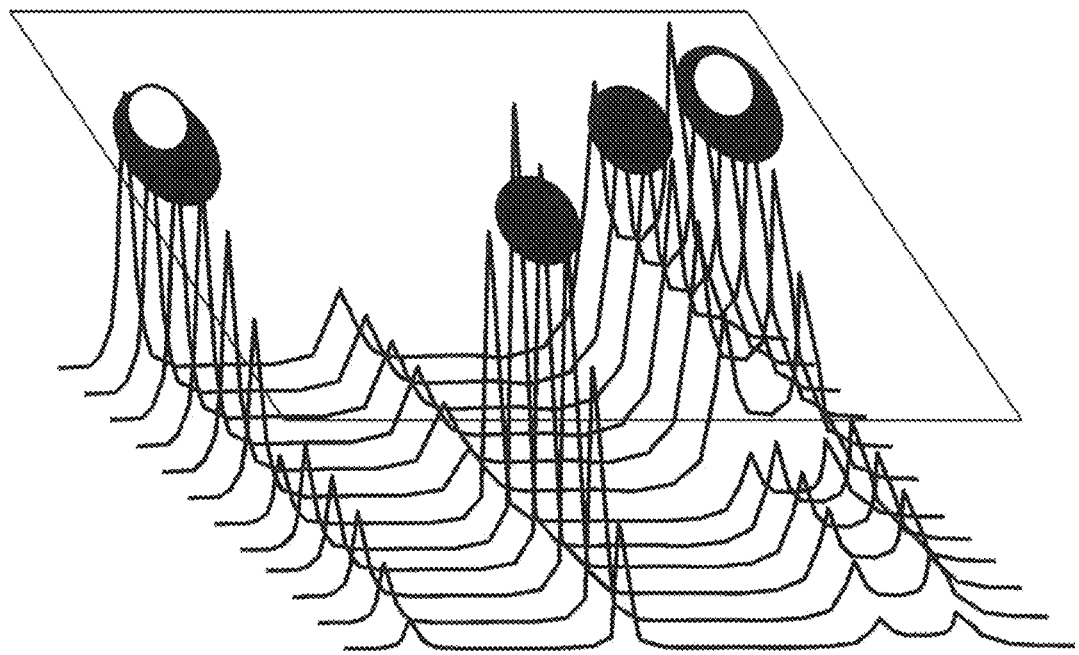
FIG. 12 is an image view of a reciprocal lattice map.

2 μm PZT (Zr/Ti=55/45) sputtering film/40 nm PZO sol-gel film/15 nm SRO sputtering film The wide reciprocal lattice mapping was performed on Samples 1 to 6. An image of the reciprocal lattice map is shown in FIG. 12.

All XRD data of the present examples were obtained by using the automatic horizontal multipurpose X-ray diffractometer SmartLab manufactured by RIGAKU Co., Ltd., and the wide reciprocal lattice mapping was measured by attaching a hybrid multi-dimension pixel detector HyPix-3000 to the SmartLab.

Figure 13:
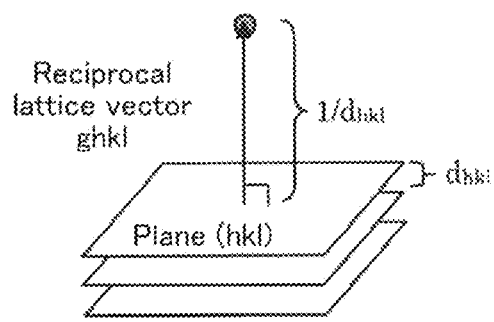
FIG. 13 is a view explaining a reciprocal lattice vector and a reciprocal lattice point of a crystal lattice plane (hkl).
Figure 14:
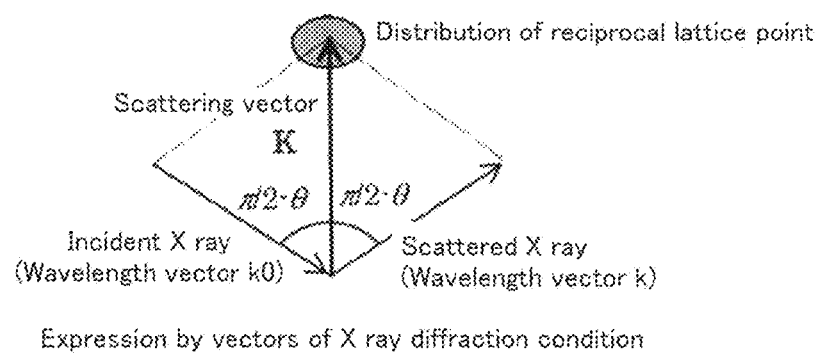
FIG. 14 is a view explaining expression by vectors of an X-ray diffraction condition.

FIG. 13 is a view explaining a reciprocal lattice vector and a reciprocal lattice point of the crystal lattice plane (hkl). FIG. 14 is a view explaining expression by vectors of an X-ray diffraction condition.

Reciprocal Lattice Vector ($g_{hkl}$)
 Size: reciprocal number of value d of plane (hkl)
 Direction: Normal direction of plane (hkl)
 Reciprocal Lattice Mapping
 Measuring extension of reciprocal lattice point on reciprocal space
 Reciprocal lattice point: top of the reciprocal lattice vector
 Condition for Generating Diffraction
 Scattering vector: $K=k-k_0$
 (Scattering vector K)=(Reciprocal lattice vector $g_{hkl}$)
 Measurement of the Reciprocal Lattice Map
 Two-dimensional distribution of the reciprocal lattice point is measured by scanning the scattering vector K.

The reciprocal lattice simulation is previously performed on the basis of the information of crystal structure, and then the measurement value is compared therewith. The reciprocal lattice map is obtained by plotting according to the following formulas qx and qz.

$$q_x = \frac{2}{\lambda}\sin\frac{2\theta}{2}\sin\left(\frac{2\theta}{2}-\omega\right) = \frac{1}{\lambda}\{\cos\omega - \cos(2\theta-\omega)\} \quad \text{[formula 1]}$$

$$q_z = \frac{2}{\lambda}\sin\frac{2\theta}{2}\cos\left(\frac{2\theta}{2}-\omega\right) = \frac{1}{\lambda}\{\sin\omega + \sin(2\theta-\omega)\}$$

2θ was measured at 10 to 120°, Ω was measured at 10 to 90°, X was measured at four stages of 0°, 30°, 60° and 90°, φ was measured in two planes at 0° and 45°. Each sample was measured according to 2 ways of φ=0° and 45°, φ=0° (//Si110), φ=45° (//Si100).

Figures 15A, 15B, 15C:
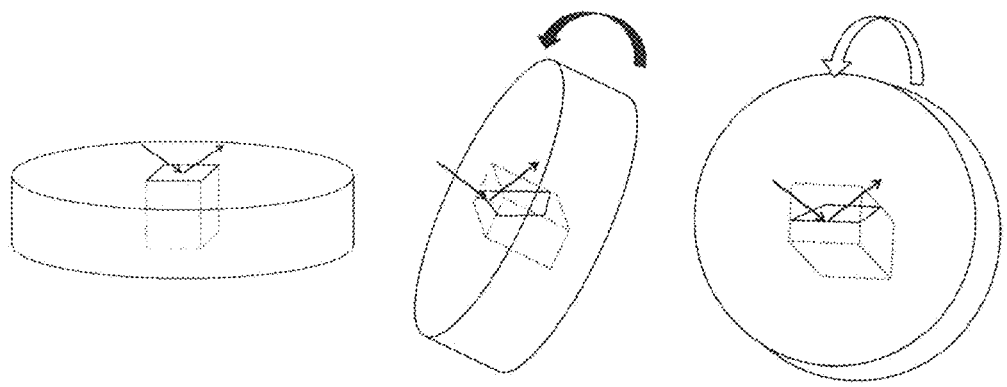
FIGS. 15A to 15C are views explaining a reciprocal lattice mapping (method).

In the case of conventional θ-2θ measurement, the measurement was conducted by fixing the substrate horizontally, and by performing irradiation with an X-ray (refer to FIG. 15A).

The θ-2θ measurement was carried out by scanning the ω axis (rotation axis of sample) and χ axis (tilting/shifting adjustment axis). In addition, the φ axis (in-plane rotation axis) was measured at two points of 0° and 45°. The reciprocal lattice mapping is obtained by qzvs.qx plotting of the results after scanning measurement of the θ-2θ/ω axis, and different components of domain are measured by overlapping all of the reciprocal lattice mappings on one plane while scanning several stages of the χ axis at the same time, with the result that superiority and inferiority in a true degree of orientation is known (refer to FIGS. 15B and 15C).

Figure 16:
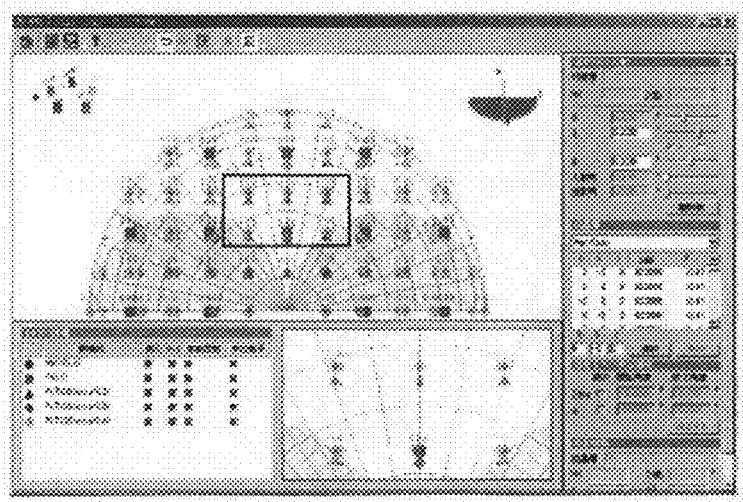
FIG. 16 is a view explaining the reciprocal lattice mapping (method).

Arrangement of the reciprocal lattice points was previously simulated by using the soft application SmartLab Guidance manufactured by RIGAKU Co., Ltd. on the basis of the known information of PZT crystal structure as shown in FIG. 16, and analysis of the film condition was carried out by overlapping on the measured value.

Figure 17:
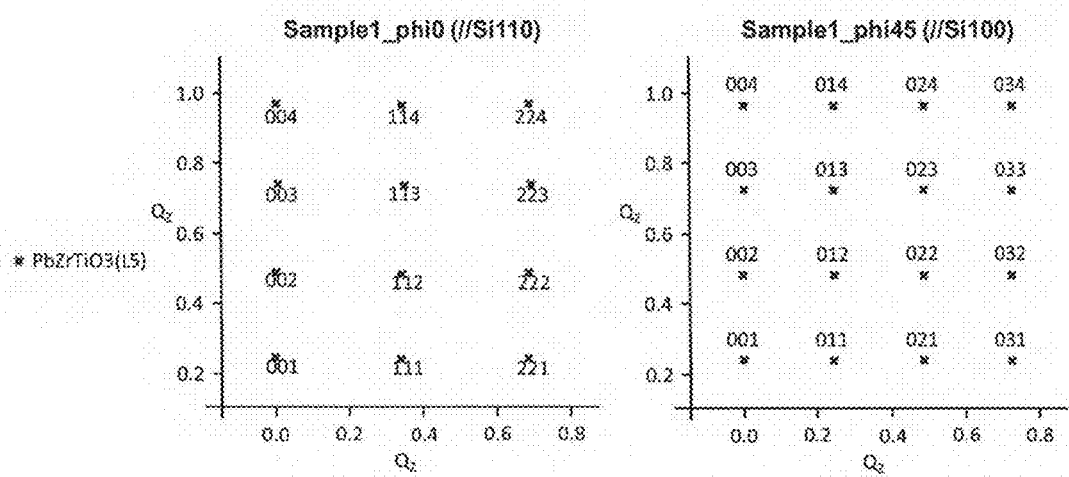
FIG. 17 shows simulation results of a reciprocal lattice of a PZT single crystal.
Figure 18:
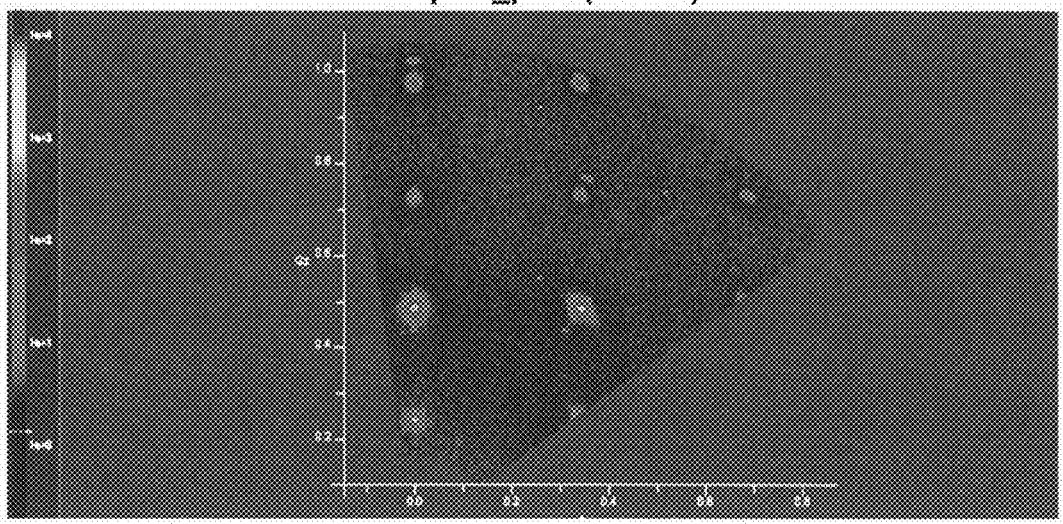
FIG. 18 shows a result of reciprocal lattice map measurement of a Sample 1 at φ=0° (//Si110).
Figure 19:
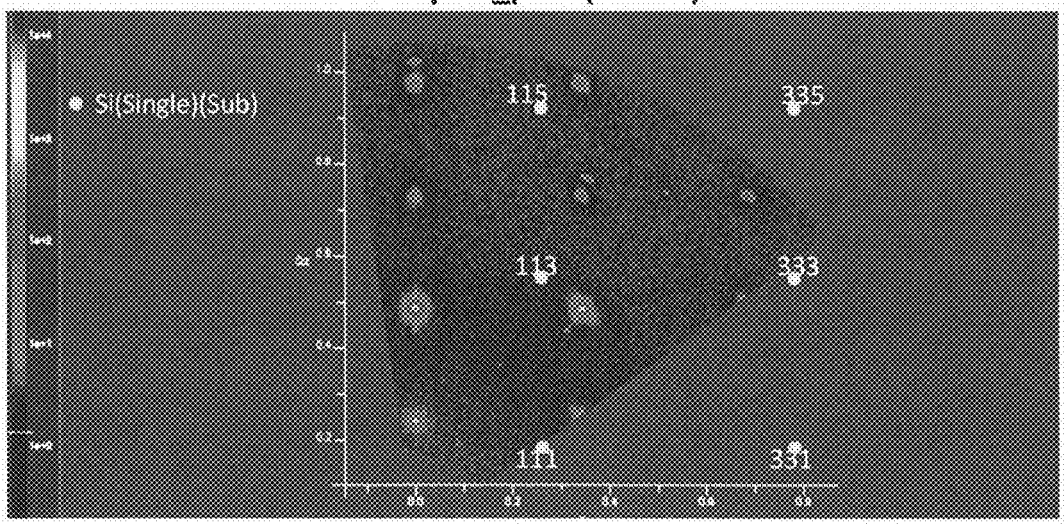
FIG. 19 shows a result of reciprocal lattice map measurement of the Sample 1 at φ=0° (//Si110).
Figure 20:
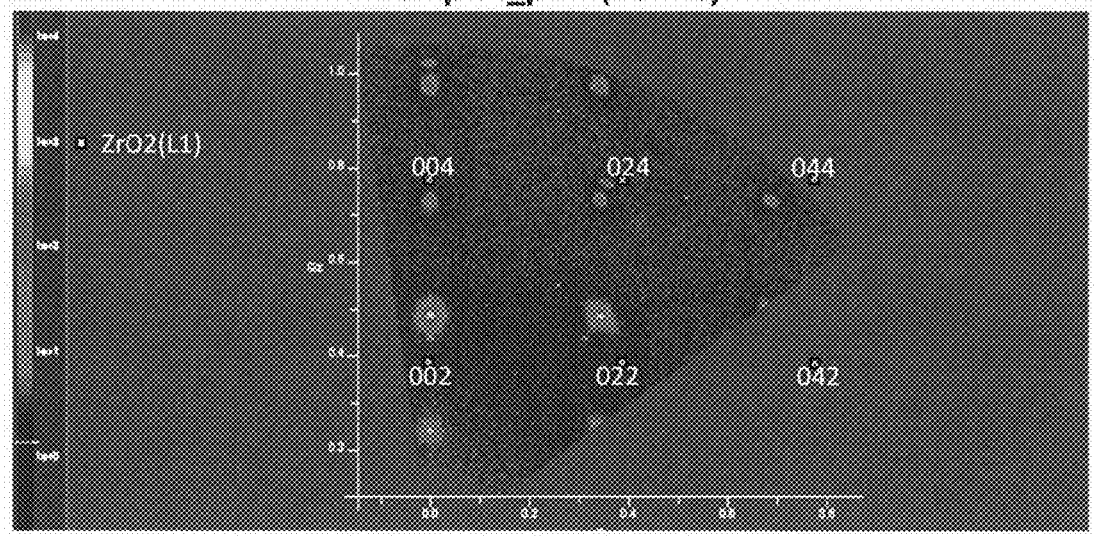
FIG. 20 shows a result of reciprocal lattice map measurement of the Sample 1 at φ=0° (//Si110).
Figure 21:
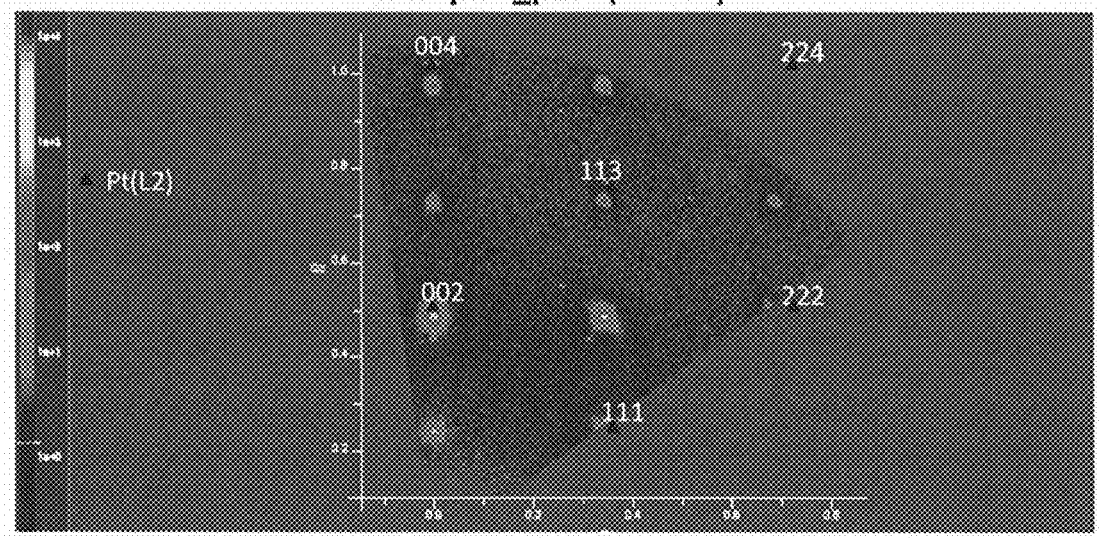
FIG. 21 shows a result of reciprocal lattice map measurement of the Sample 1 at φ=0° (//Si110).
Figure 22:
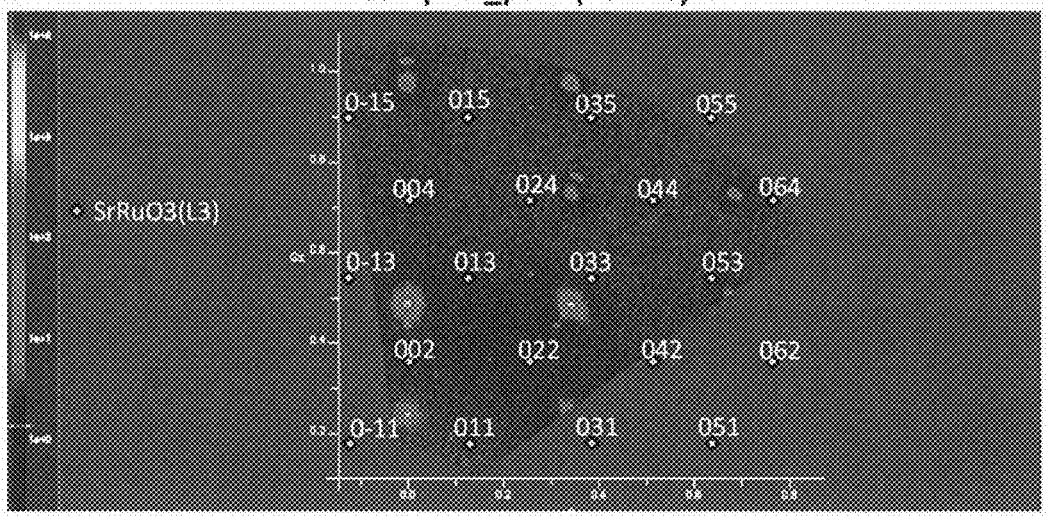
FIG. 22 shows a result of reciprocal lattice map measurement of the Sample 1 at φ=0° (//Si110).
Figure 23:
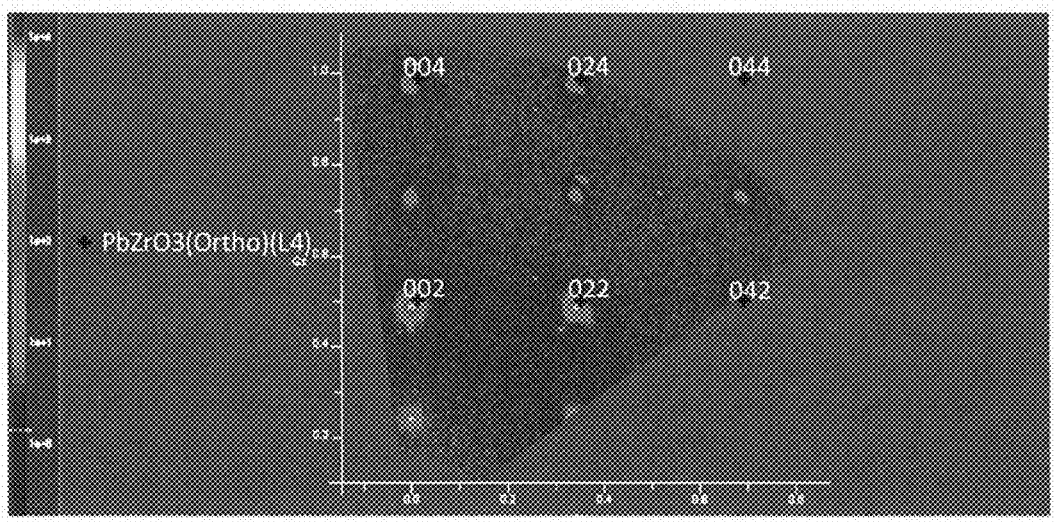
FIG. 23 shows a result of reciprocal lattice map measurement of the Sample 1 at φ=0° (//Si110).
Figure 24:
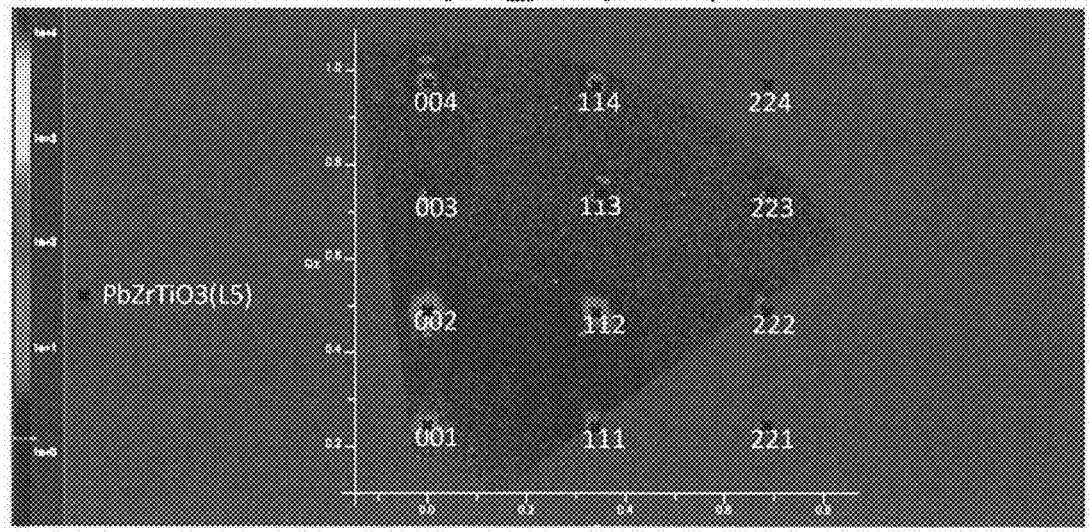
FIG. 24 shows a result of reciprocal lattice map measurement of the Sample 1 at φ=0° (//Si110).
Figure 25:
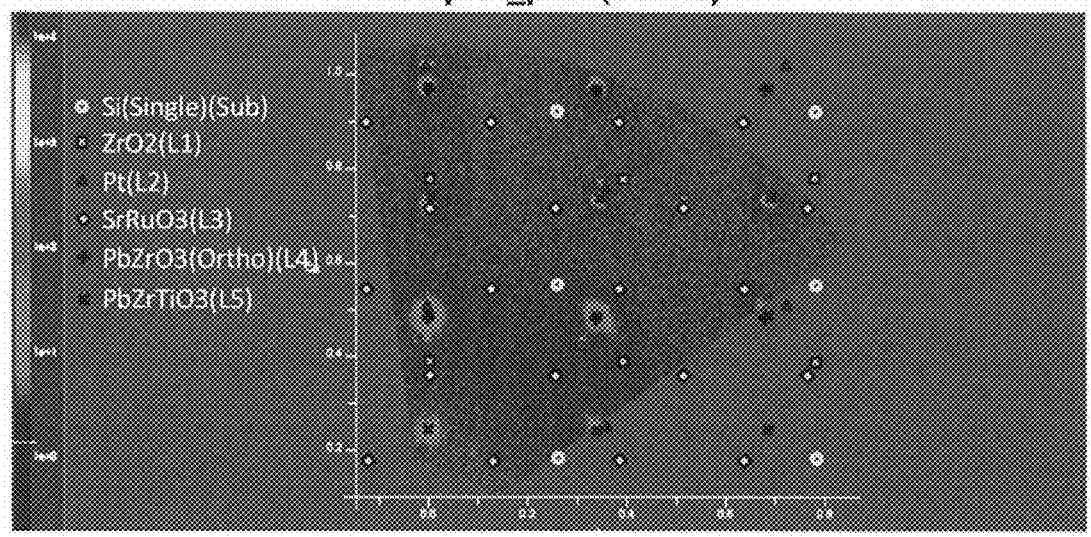
FIG. 25 shows a result of reciprocal lattice map measurement of the Sample 1 at φ=0° (//Si110).
Figure 26:
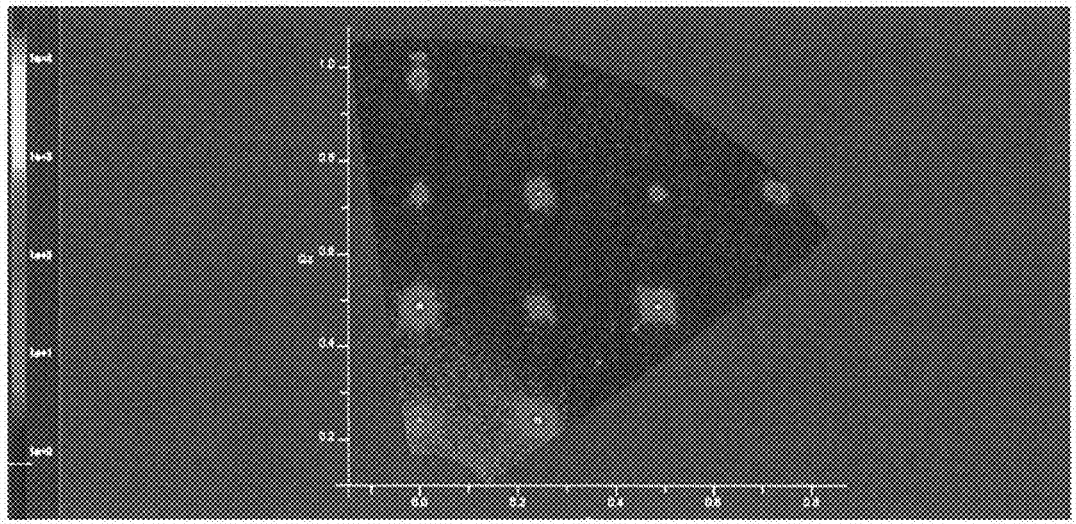
FIG. 26 shows a result of reciprocal lattice map measurement of the Sample 1 at φ=45° (//Si100).
Figure 27:
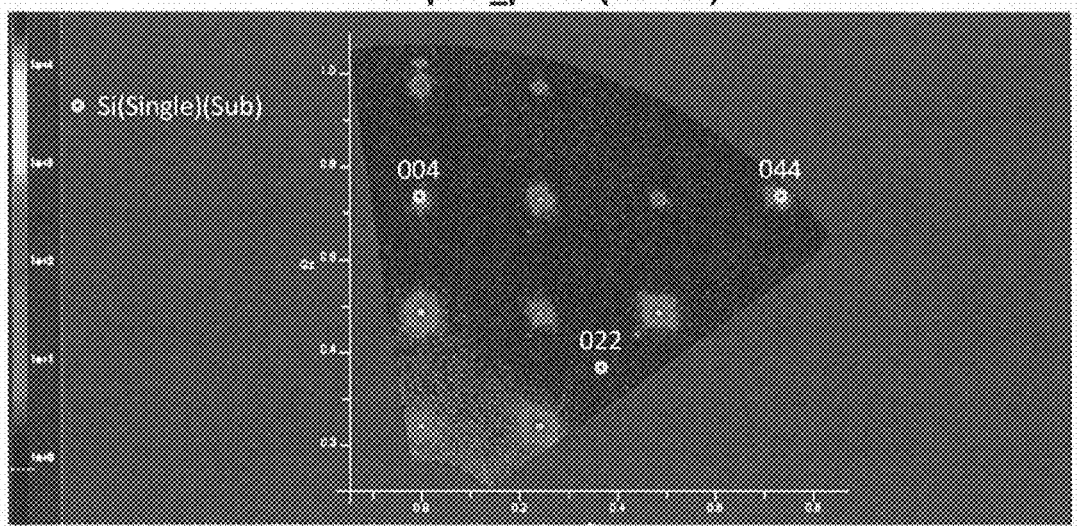
FIG. 27 shows a result of reciprocal lattice map measurement of the Sample 1 at φ=45° (//Si100).
Figure 28:
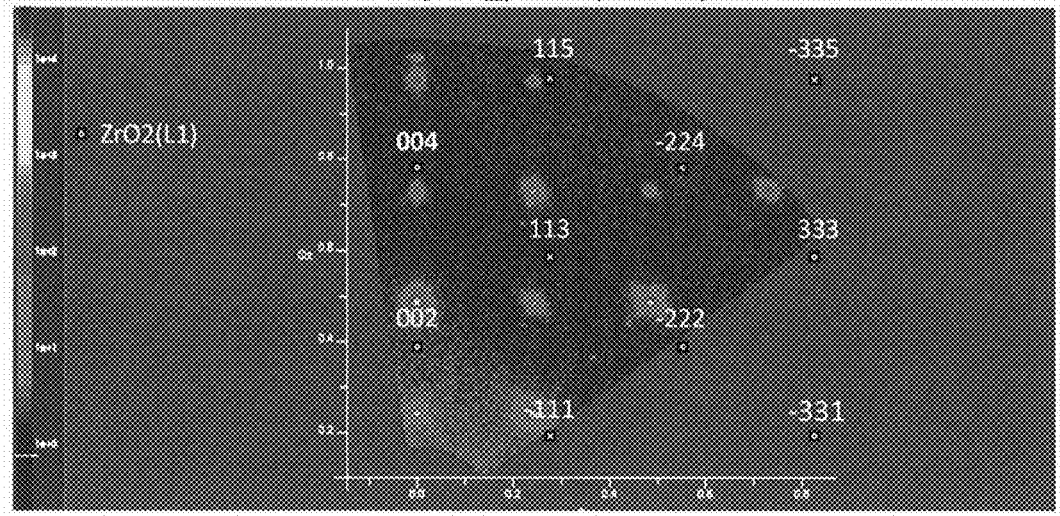
FIG. 28 shows a result of reciprocal lattice map measurement of the Sample 1 at φ=45° (//Si100).
Figure 29:
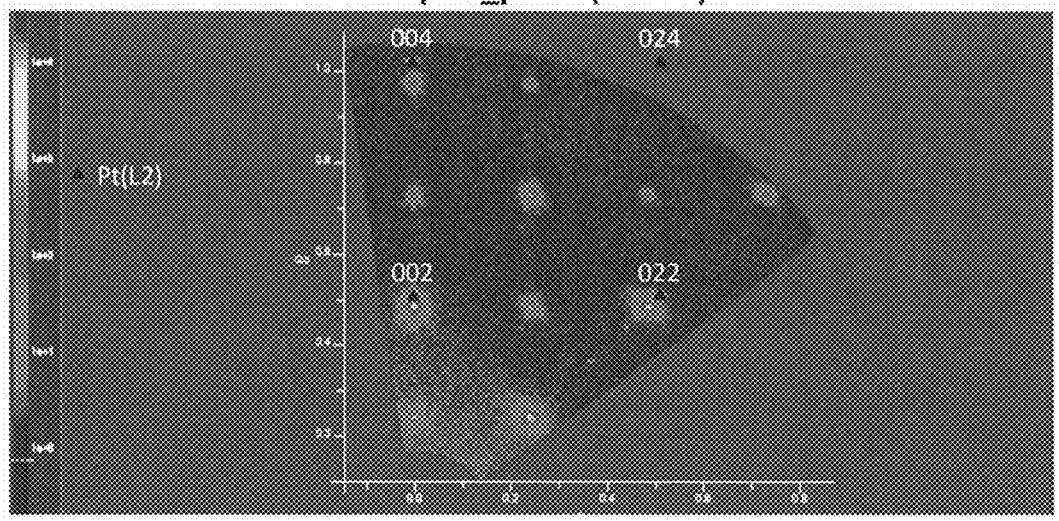
FIG. 29 shows a result of reciprocal lattice map measurement of the Sample 1 at φ=45° (//Si100).
Figure 30:
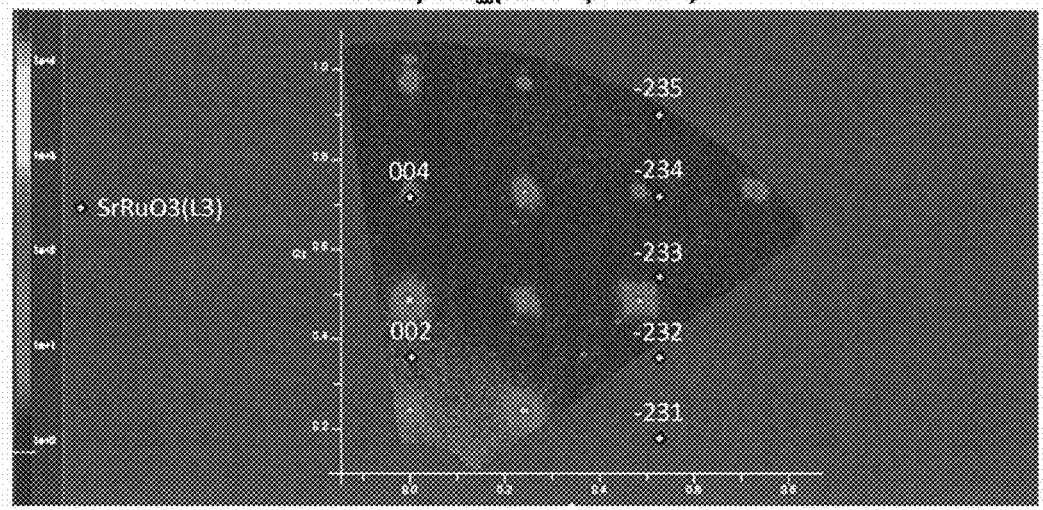
FIG. 30 shows a result of reciprocal lattice map measurement of the Sample 1 at φ=45° (//Si100).
Figure 31:
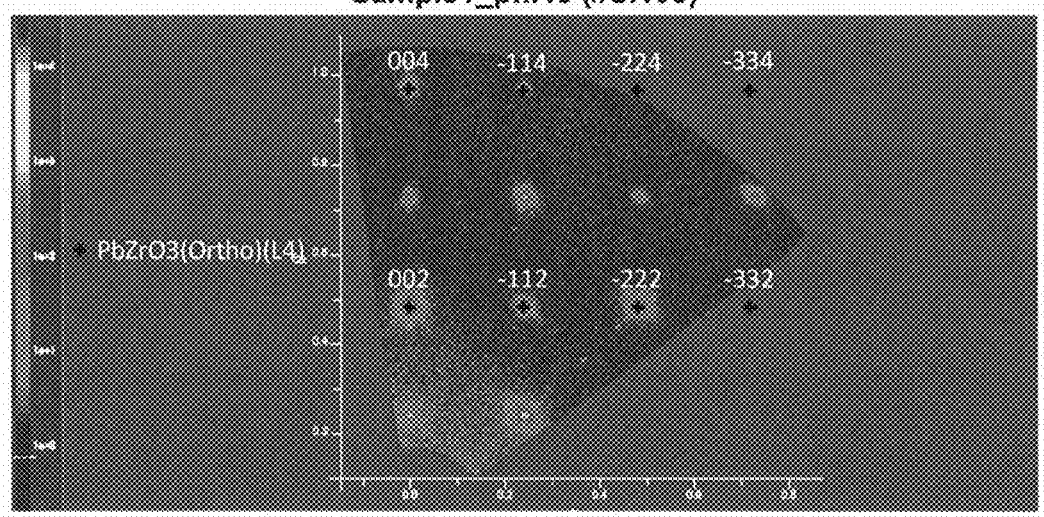
FIG. 31 shows a result of reciprocal lattice map measurement of the Sample 1 at φ=45° (//Si100).
Figure 32:
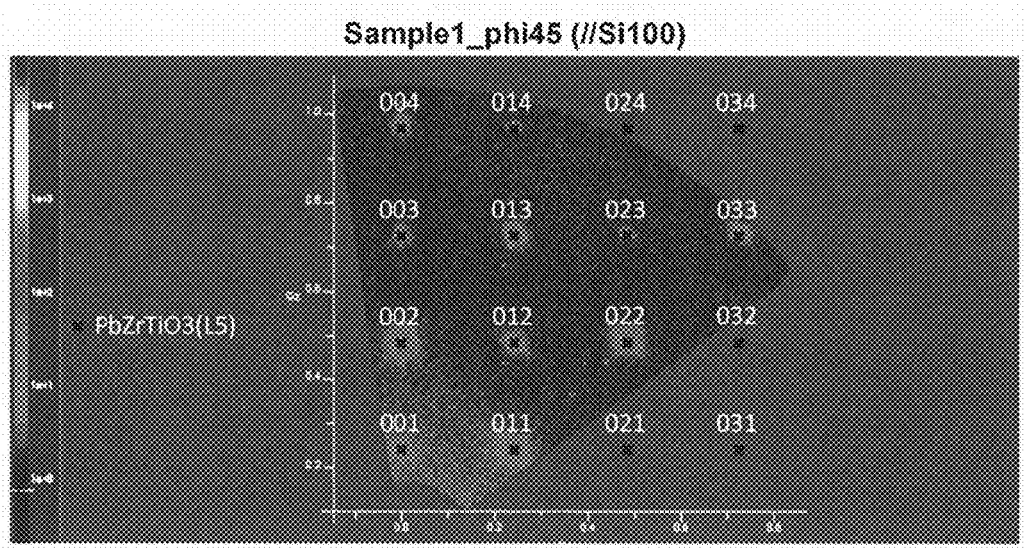
FIG. 32 shows a result of reciprocal lattice map measurement of the Sample 1 at φ=45° (//Si100).
Figure 33:
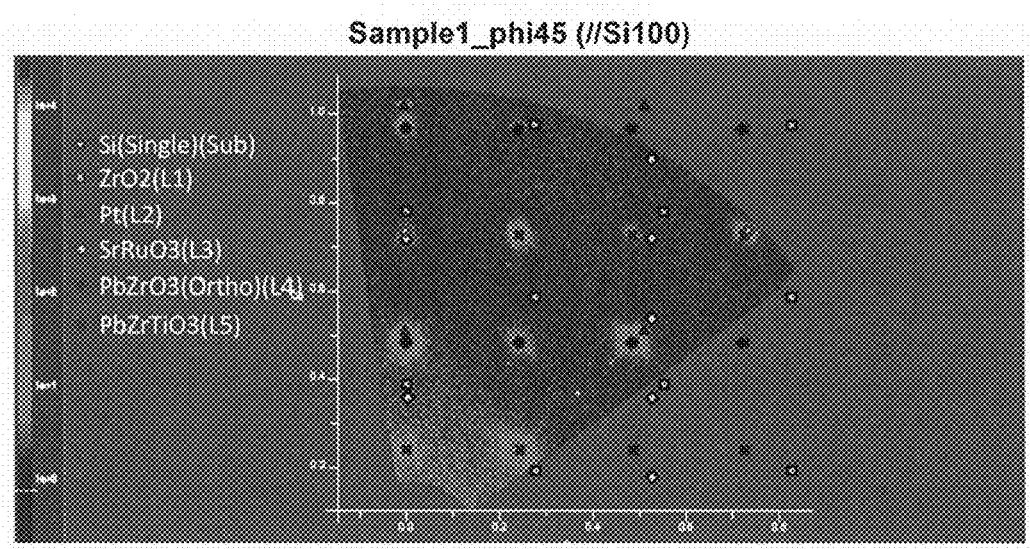
FIG. 33 shows a result of reciprocal lattice map measurement of the Sample 1 at φ=45° (//Si100).

FIG. 17 shows simulation results of the reciprocal lattice of the PZT single crystal.

FIGS. 18 to 25 show results of reciprocal lattice map measurement of the Sample 1 at φ=0° (//Si110). As shown in these figures, the results of the reciprocal lattice simulation in the PZT and the measurement results completely coincide with each other, and thus it is shown that the PZT film is a complete epitaxial film and exhibits crystallinity similar to single crystal (refer to FIG. 25).

FIGS. 26 to 33 show results of reciprocal lattice map measurement of the Sample 1 at φ=45° (//Si100).

Figure 34:
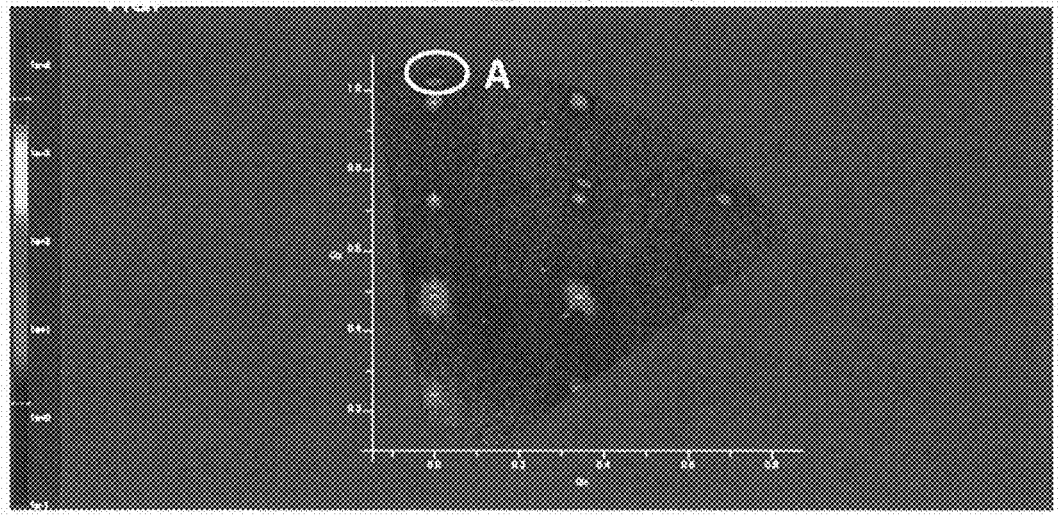
FIG. 34 shows a result of reciprocal lattice map measurement of a Sample 2 at φ=0° (//Si110).
Figure 35:
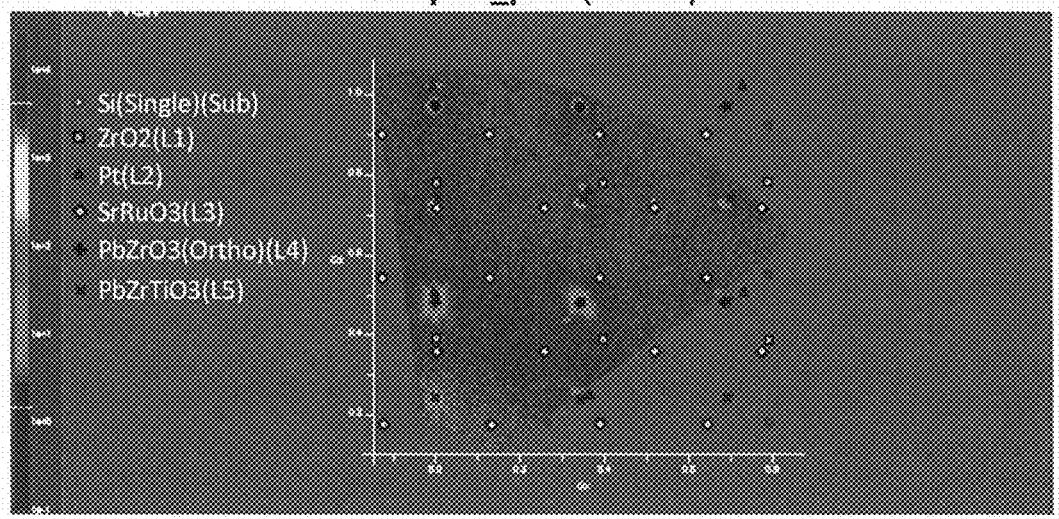
FIG. 35 shows a result of reciprocal lattice map measurement of the Sample 2 at φ=0° (//Si110).
Figure 36:
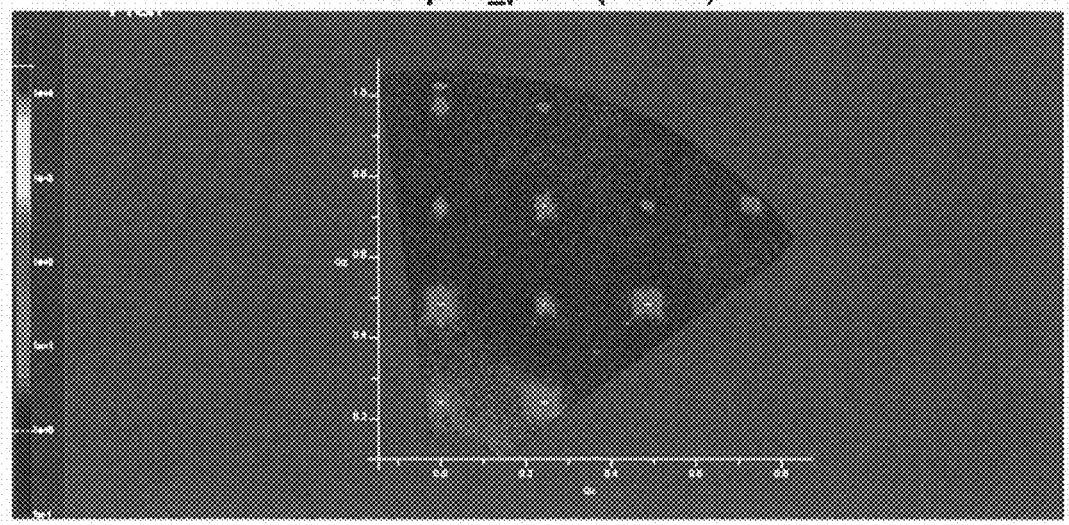
FIG. 36 shows a result of reciprocal lattice map measurement of the Sample 2 at φ=45° (//Si100).
Figure 37:
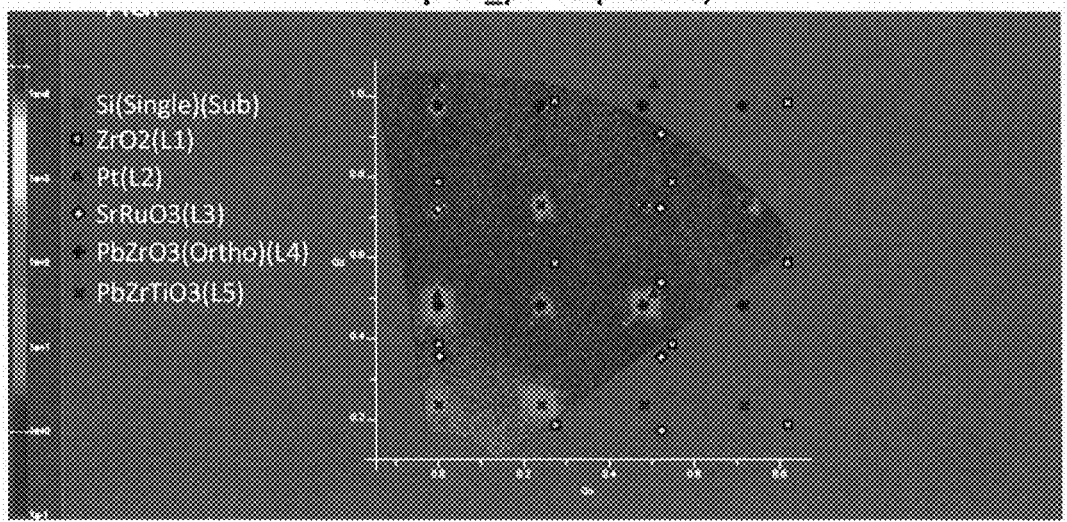
FIG. 37 shows a result of reciprocal lattice map measurement of the Sample 2 at φ=45° (//Si100).
Figure 38:
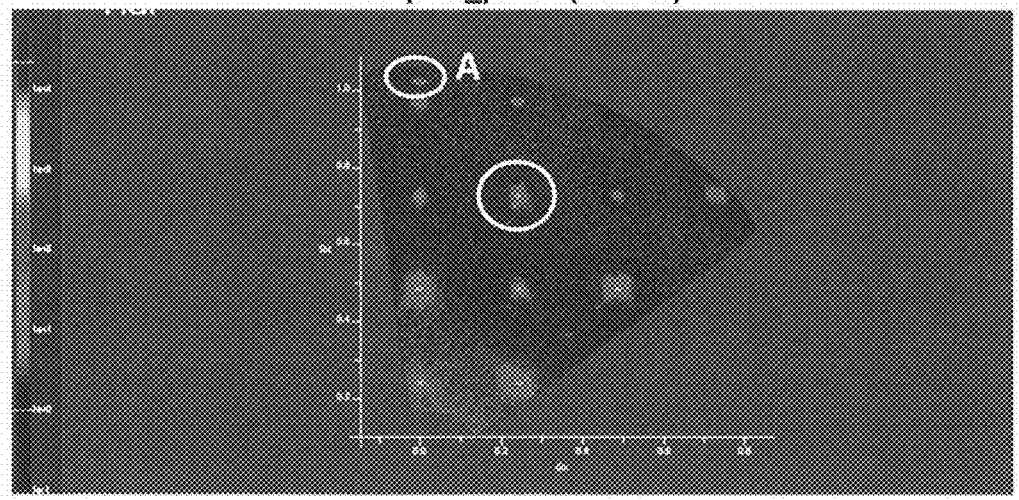
FIG. 38 shows a result of reciprocal lattice map measurement of the Sample 2 at φ=45° (//Si100).

FIGS. 34 to 35 show results of reciprocal lattice map measurement of the Sample 2 at φ=0° (//Si110).

Figure 39:
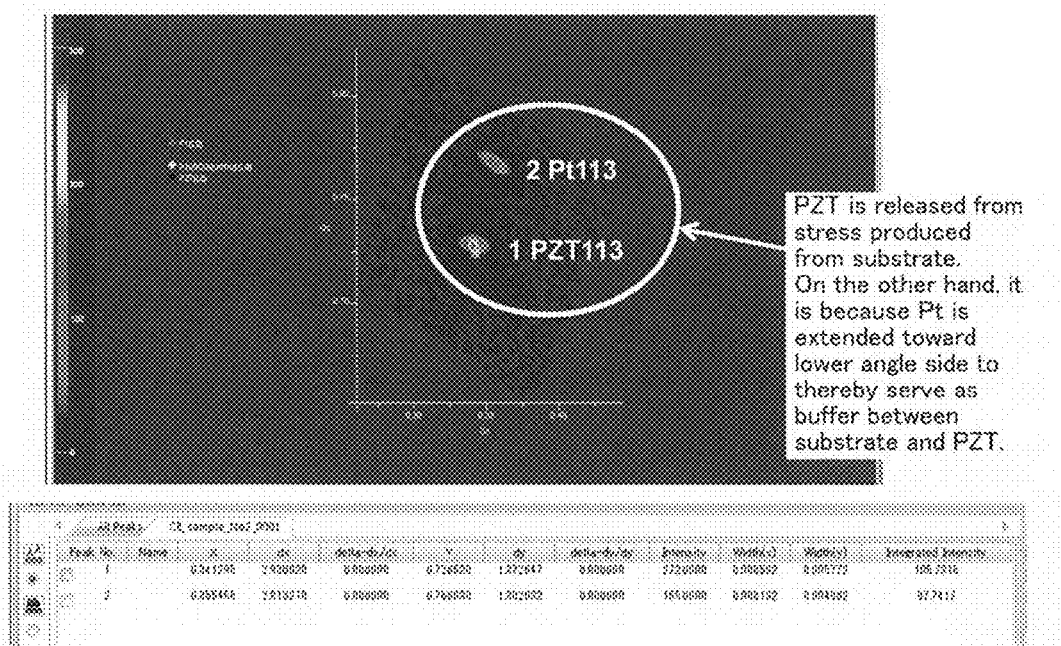
FIG. 39 shows a result of reciprocal lattice map measurement of the Sample 2 at φ=45° (//Si100).

FIGS. 36 to 39 show results of reciprocal lattice map measurement of the Sample 2 at 0=45° (//Si100). As shown in FIG. 39, the PZT is released from stress from a substrate. On the other hand, this is caused by elongating Pt to the lower angle side, and by serving as a buffer between the substrate and the PZT.

Figures 40, 41:
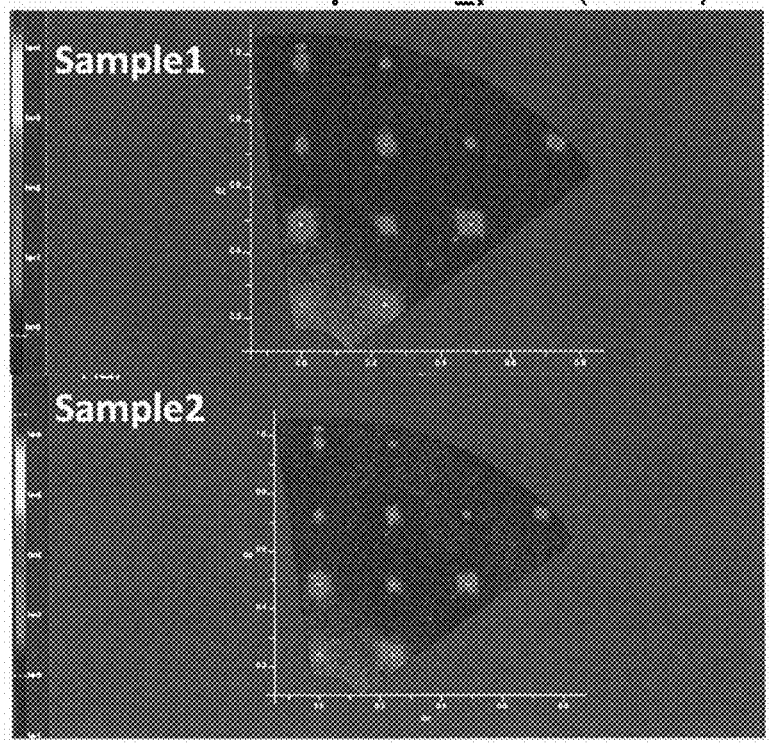
FIG. 40 shows a result of reciprocal lattice map measurement of the Samples 1 and 2 at φ=45° (//Si100).
FIG. 41 shows a result of reciprocal lattice map measurement of a Sample 3 at φ=0° (//Si110).

FIG. 40 shows a results of reciprocal lattice map measurement of the Samples 1 and 2 at φ=45° (//Si100).

Figure 42:
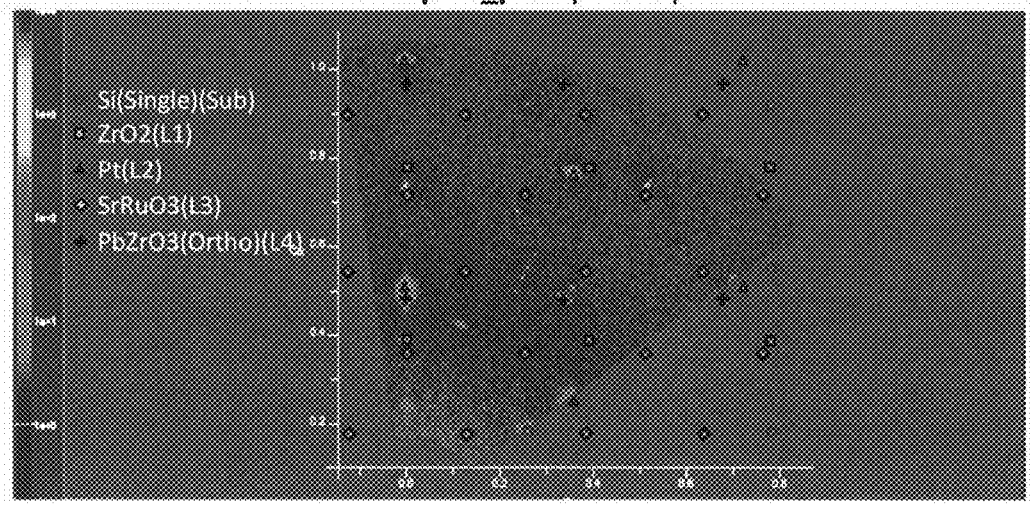
FIG. 42 shows a result of reciprocal lattice map measurement of the Sample 3 at φ=0° (//Si110).

FIGS. 41 to 42 show a results of reciprocal lattice map measurement of a Sample 3 at φ=0° (//Si110).

Figure 43:
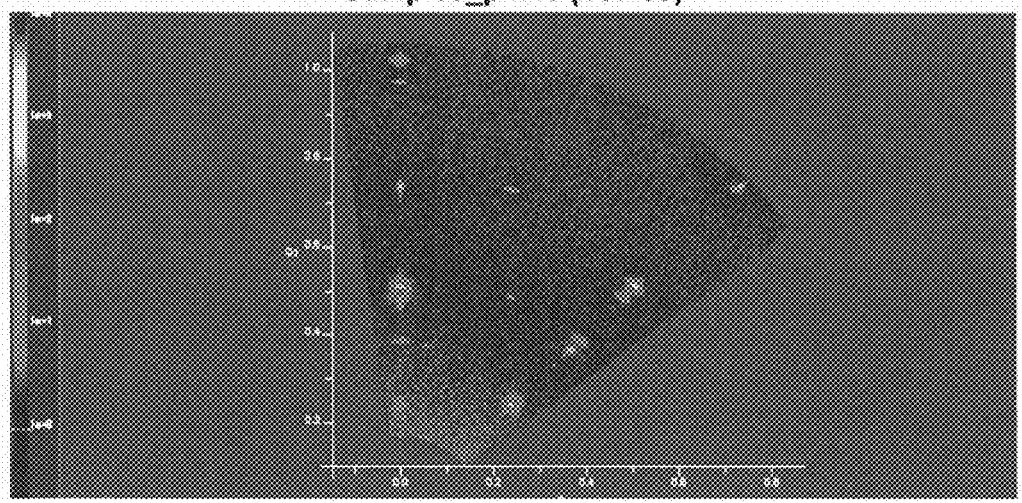
FIG. 43 shows a result of reciprocal lattice map measurement of the Sample 3 at φ=45° (//Si100).
Figure 44:
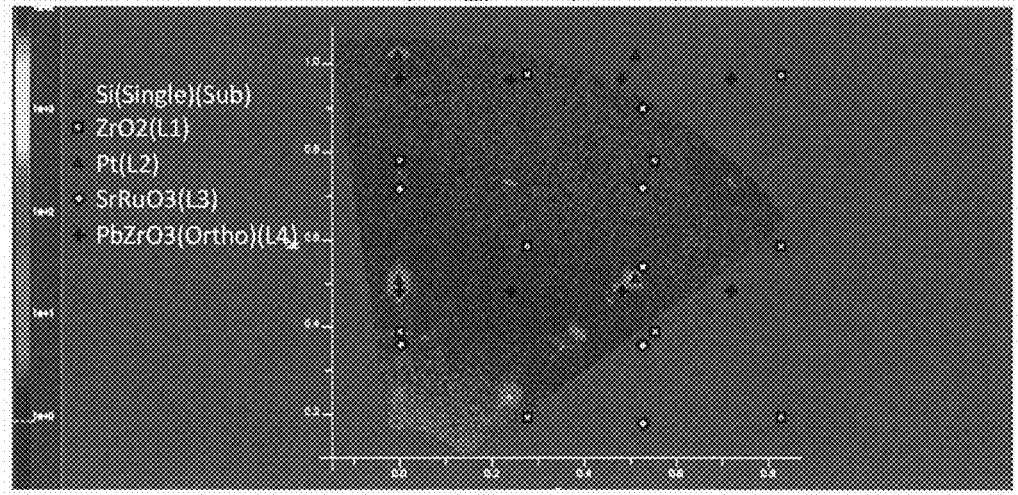
FIG. 44 shows a result of reciprocal lattice map measurement of the Sample 3 at φ=45° (//Si100).

FIGS. 43 to 44 show a results of reciprocal lattice map measurement of the Sample 3 at φ=45° (//Si100).

Figure 45:
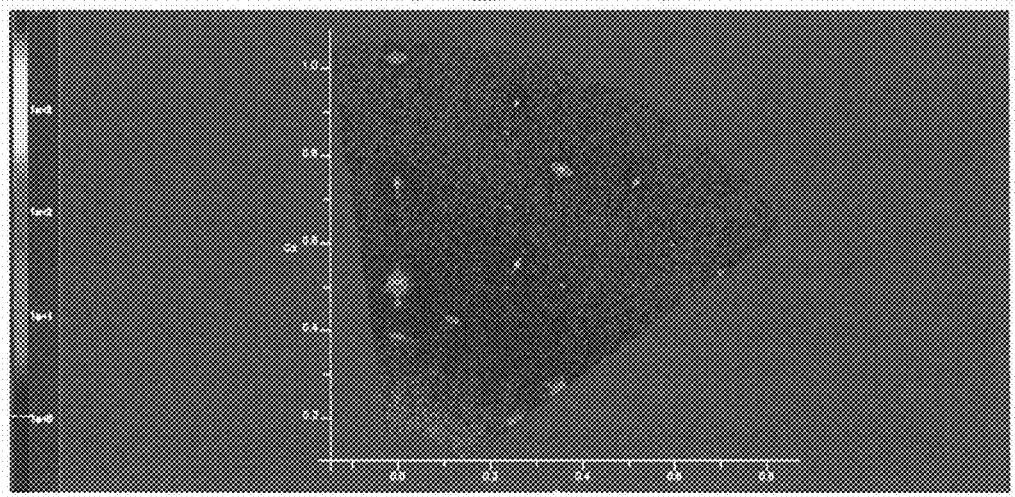
FIG. 45 shows a result of reciprocal lattice map measurement of the Sample 4 at φ=0° (//Si110).
Figure 46:
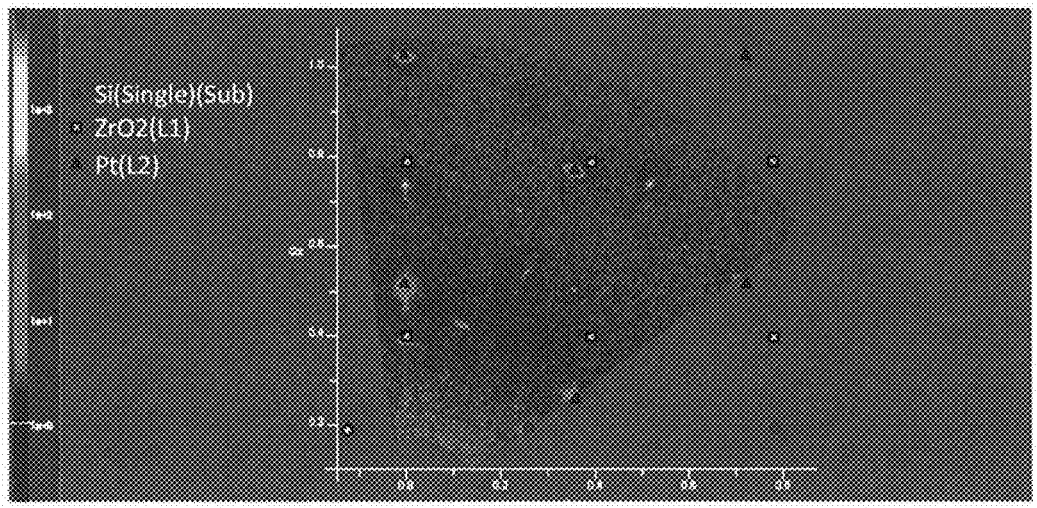
FIG. 46 shows a result of reciprocal lattice map measurement of the Sample 4 at φ=0° (//Si110).
Figure 47:
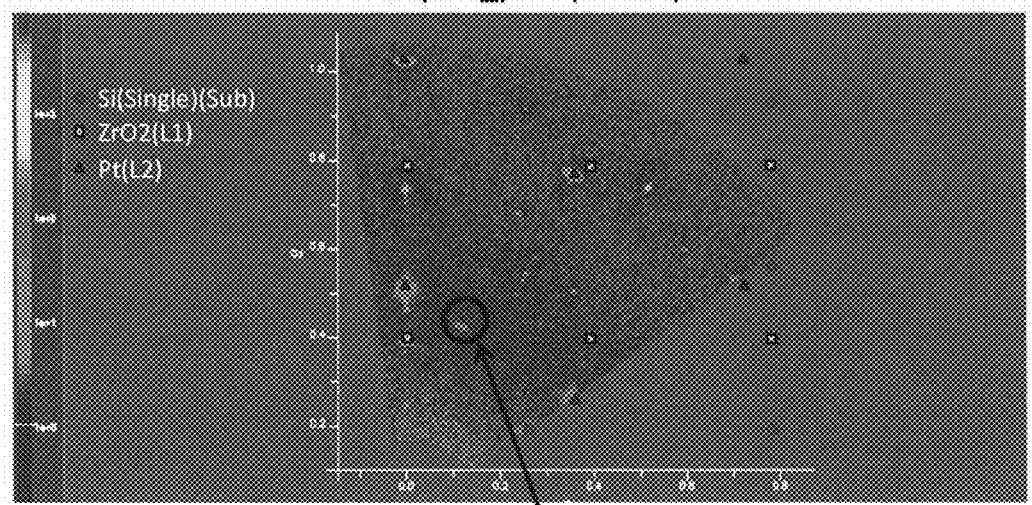
FIG. 47 shows a result of reciprocal lattice map measurement of the Sample 4 at φ=0° (//Si110).

FIGS. 45 to 47 show results of reciprocal lattice map measurement of the Sample 4 at φ=0° (//Si110). As shown in FIG. 47, according to an ordinary θ-2θ, it has been confirmed that there exists other domain Pt (111) which is inclined at an angle of about 20° and which cannot be evaluated.

Figure 48:
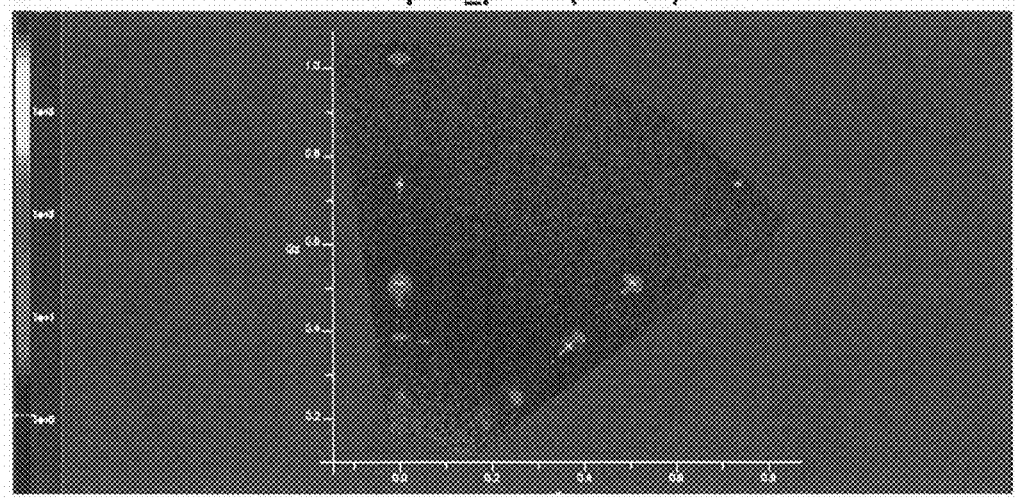
FIG. 48 shows a result of reciprocal lattice map measurement of the Sample 4 at φ=45° (//Si100).
Figure 49:
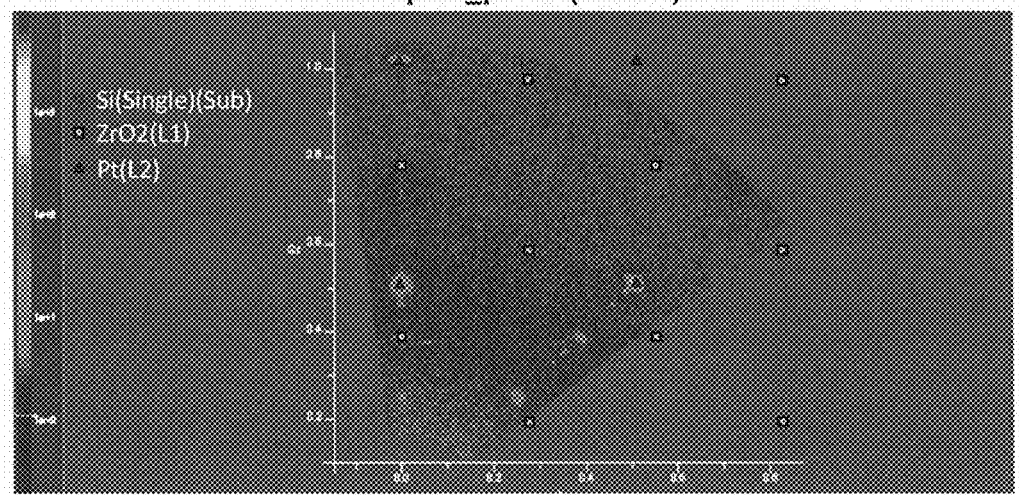
FIG. 49 shows a result of reciprocal lattice map measurement of the Sample 4 at φ=45° (//Si100).

FIGS. 48 to 49 show results of reciprocal lattice map measurement of the Sample 4 at φ=45° (//Si100).

Figure 50:
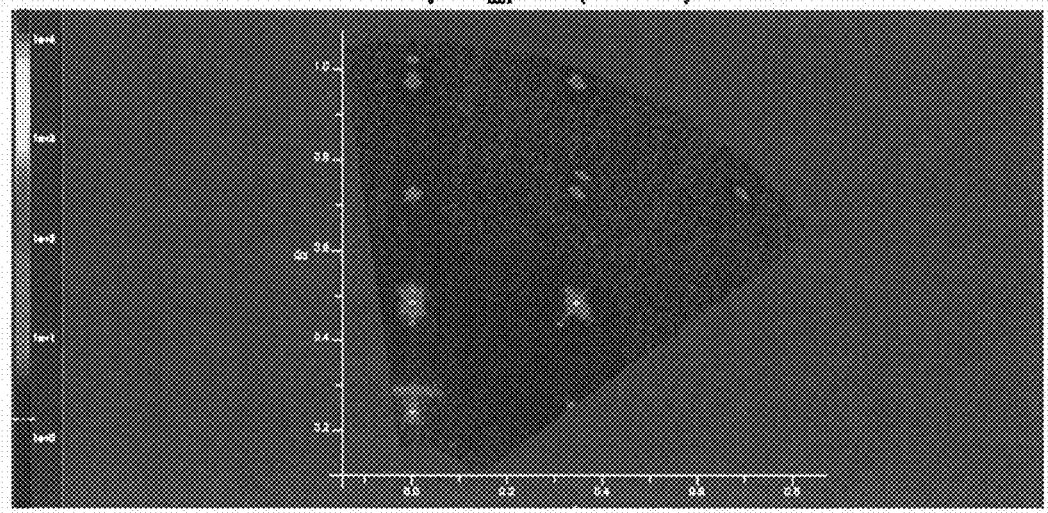
FIG. 50 shows a result of reciprocal lattice map measurement of a Sample 5 at φ=0° (//Si110).
Figure 51:
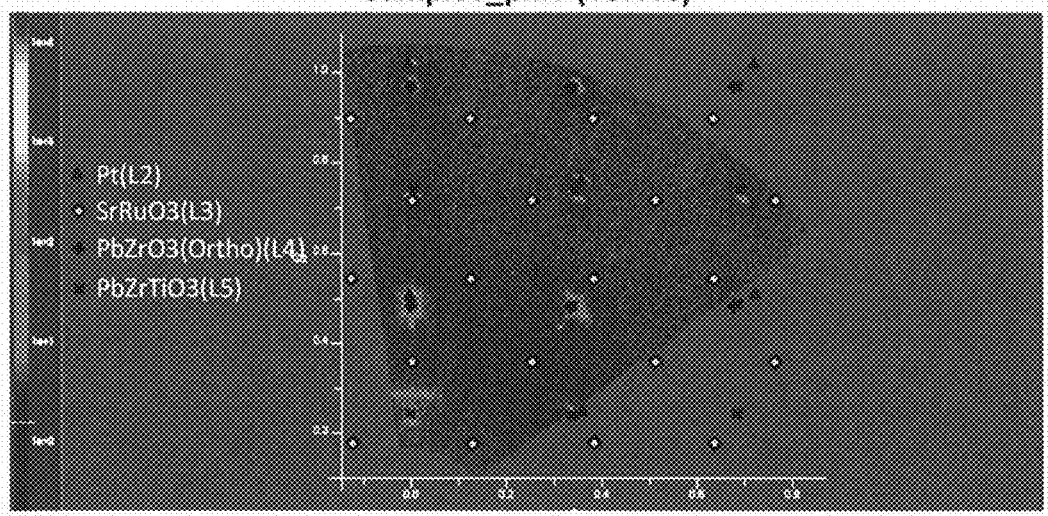
FIG. 51 shows a result of reciprocal lattice map measurement of the Sample 5 at φ=0° (//Si110).

FIGS. 50 to 51 show results of reciprocal lattice map measurement of the Sample 5 at φ=0° (//Si110).

Figure 52:
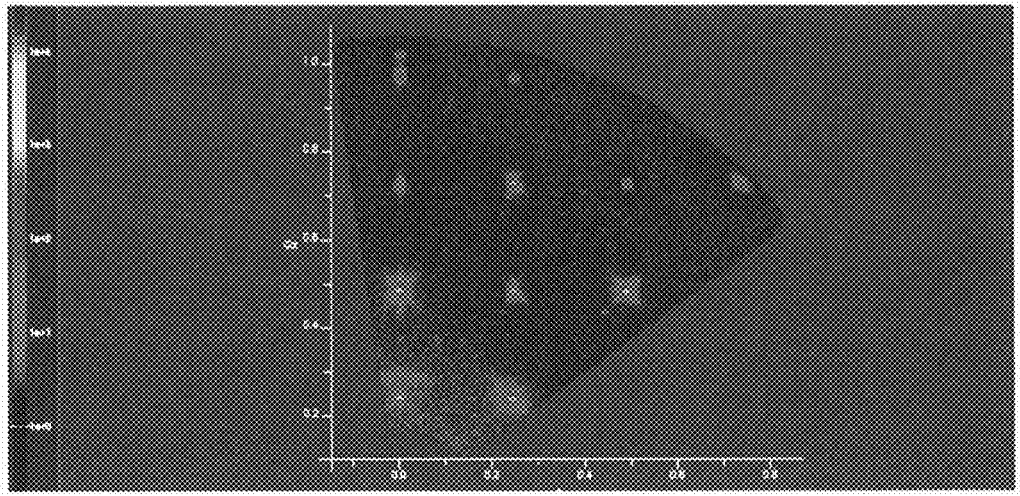
FIG. 52 shows a result of reciprocal lattice map measurement of the Sample 5 at φ=45° (//Si100).
Figure 53:
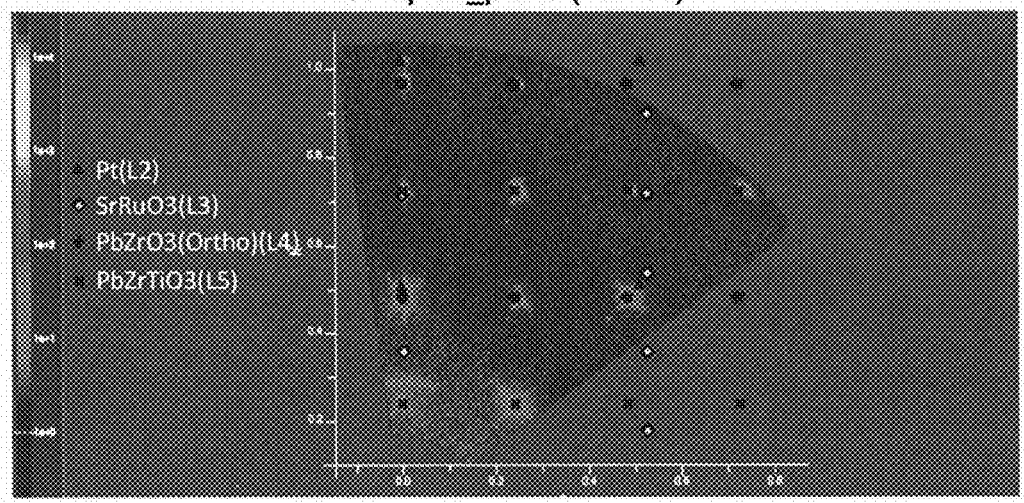
FIG. 53 shows a result of reciprocal lattice map measurement of the Sample 5 at φ=45° (//Si100).

FIGS. 52 to 53 show results of reciprocal lattice map measurement of the Sample 5 at φ=45° (//Si100).

Figure 54:
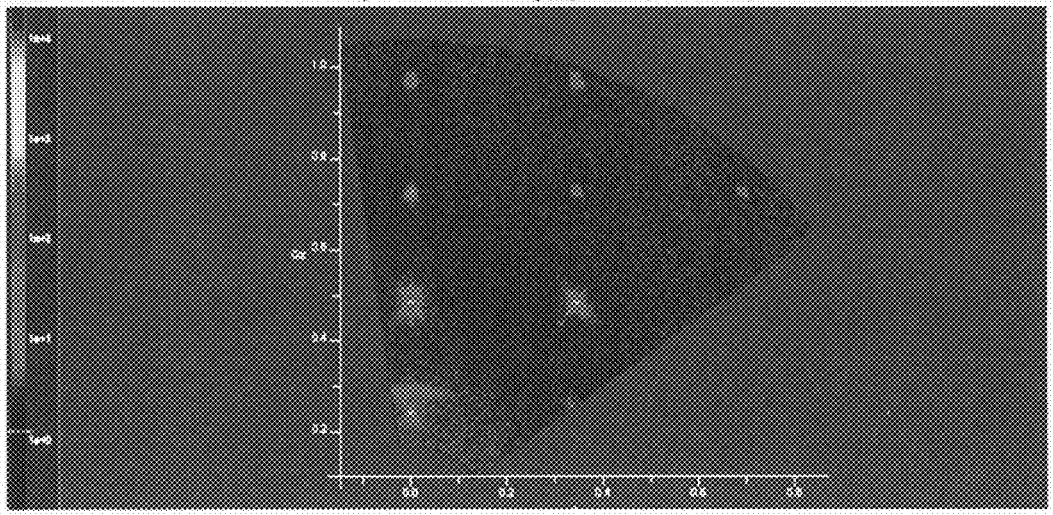
FIG. 54 shows a result of reciprocal lattice map measurement of a Sample 6 at φ=0° (//Si110).
Figure 55:
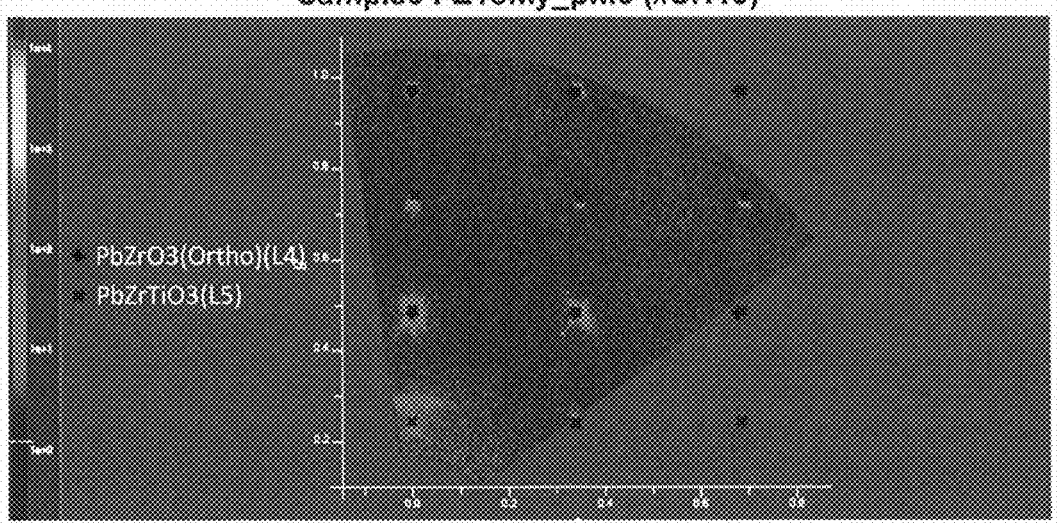
FIG. 55 shows a result of reciprocal lattice map measurement of the Sample 6 at φ=0° (//Si110).

FIGS. 54 to 55 show results of reciprocal lattice map measurement of the Sample 6 at φ=0° (//Si110).

Figure 56:
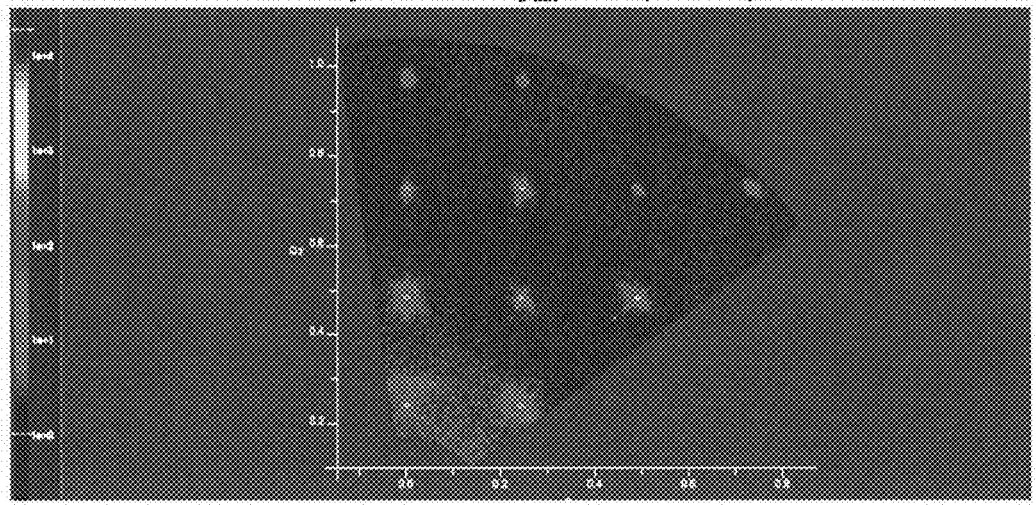
FIG. 56 shows a result of reciprocal lattice map measurement of the Sample 6 at φ=45° (//Si100).
Figure 57:
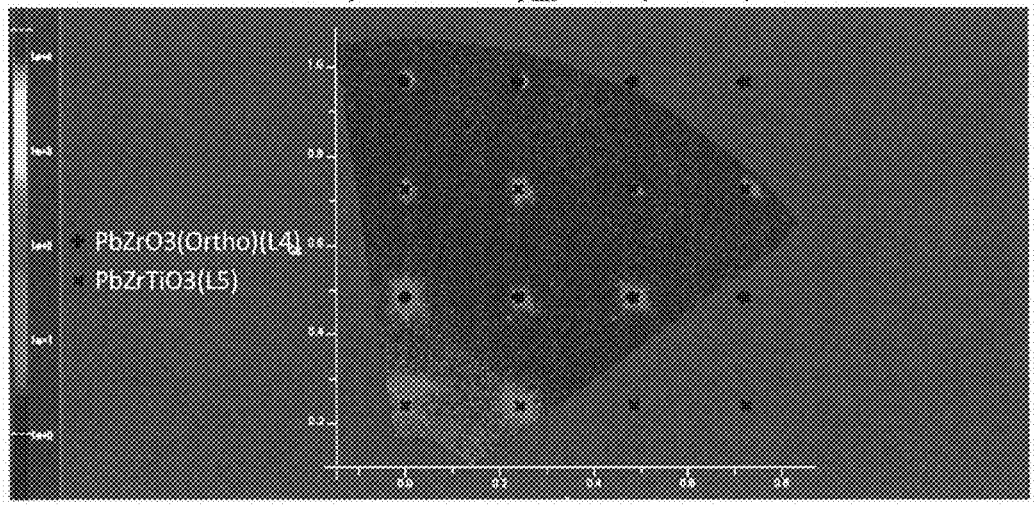
FIG. 57 shows a result of reciprocal lattice map measurement of the Sample 6 at φ=45° (//Si100).

FIGS. 56 to 57 show results of reciprocal lattice map measurement of the Sample 6 at φ=45° (//Si100).

The PZT has the columnar structure.

Comparative Examples 2-1, and 2-2

Figure 58:
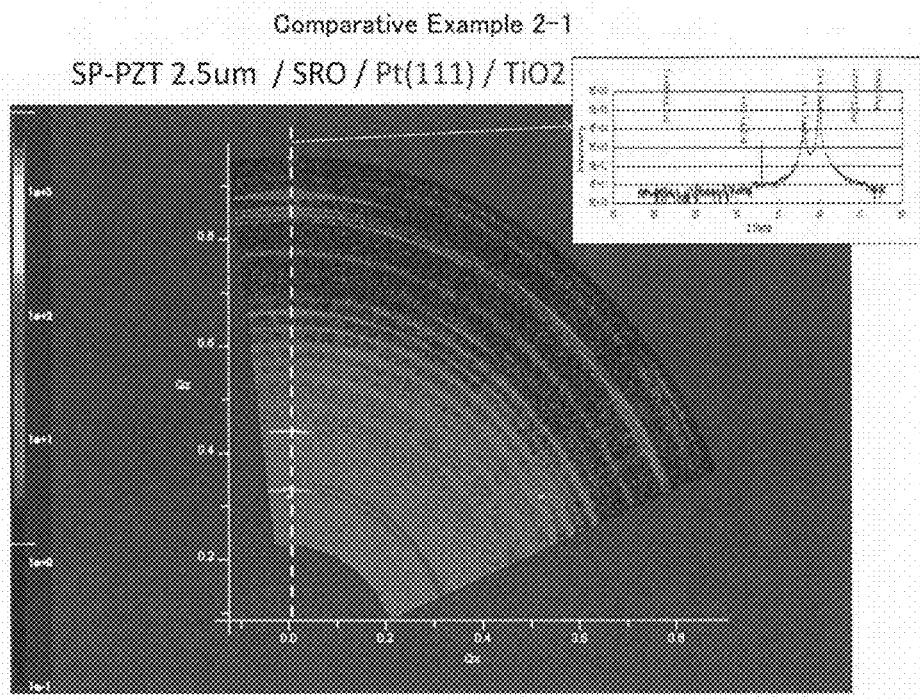
FIG. 58 shows a result of reciprocal lattice map measurement of a sample of a Comparative Example 2-1.
Figure 59:
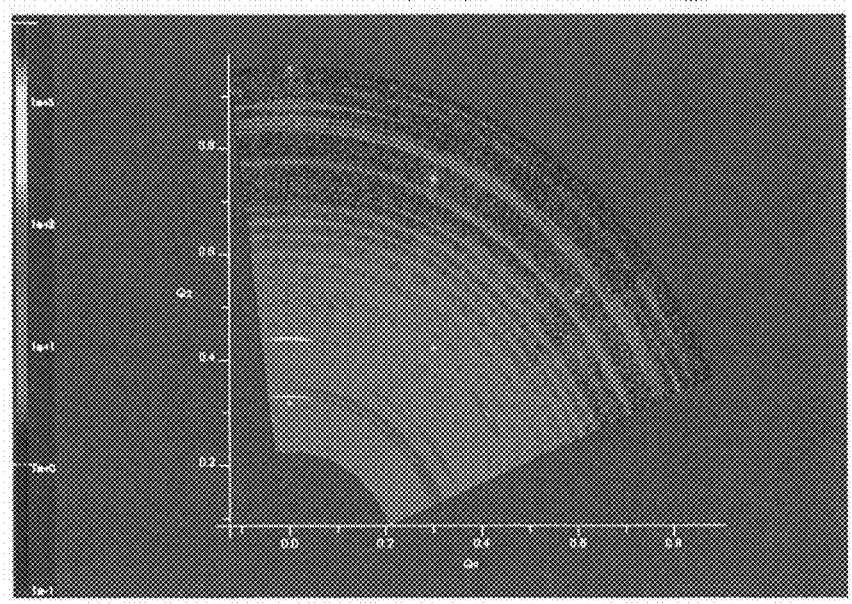
FIG. 59 shows a result of reciprocal lattice map measurement of a sample of a Comparative Example 2-2.

An ordinary columnar structural PZT film formed on a Pt lower electrode (formed on a Si substrate) was rotated within the plane as shown in FIGS. 58 and 59, and also with respect to the direction of the z axis, there are numerous circles indicating various planes, and thus the film was a non-orientation film, and also the respective columns have no correlation with each other.

Comparative Examples 3-1, and 3-2

Figure 60:
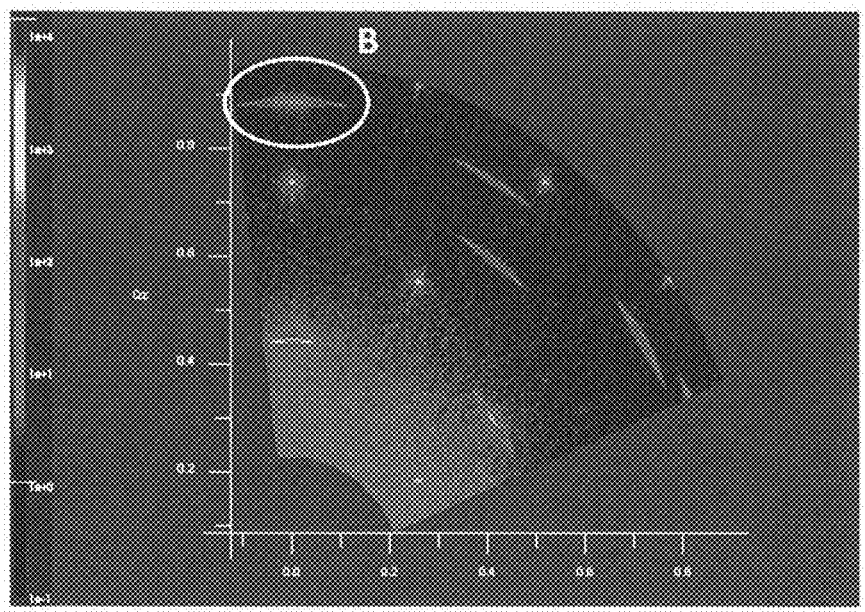
FIG. 60 shows a result of reciprocal lattice map measurement of a sample of a Comparative Example 3-1.
Figure 61:
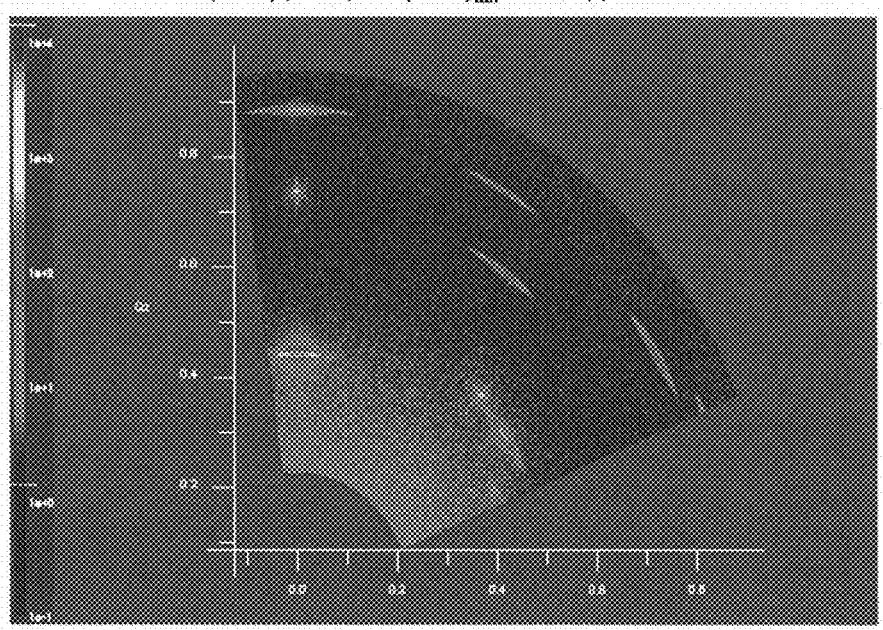
FIG. 61 shows a result of reciprocal lattice map measurement of a sample of a Comparative Example 3-2.

As shown in FIGS. 60 and 61, although the thin film is a good epitaxial film and begins to exhibit spots oriented in the considerably constant orientation, the shape of the spot is still flat, and is flattened due to a strong stress from the substrate, and there are many rotating components in the plane, which are also considerably flat.

In the case of Comparative Example 2-1 shown in FIG. 58, only from the measurement results of θ-2θ (particularly in case of 2θ≤50°), the film appears to be a very good PZT (111) strong-orientation film. However, in the case of Comparative Example 2-1, from the measurement results of the wide reciprocal lattice mapping, the distribution of the reciprocal lattice point at Qx=0° appears to correspond to a very good PZT (111) strong-orientation film only from the measurement results of the θ-2θ (particularly in case of) 2θ≤50°). However, the crystal orientation is observed to have a variation all over the range of the reciprocal lattice mapping measurement, and the film is concluded to be a non-orientation film as a whole, with the result that it can be predicted that the self-polarization in the whole film disappears and self-polling is not carried out. Furthermore, it is predicted that piezoelectric property cannot almost be obtained without polling treatment, due to non-orientation film.

Figure 62:
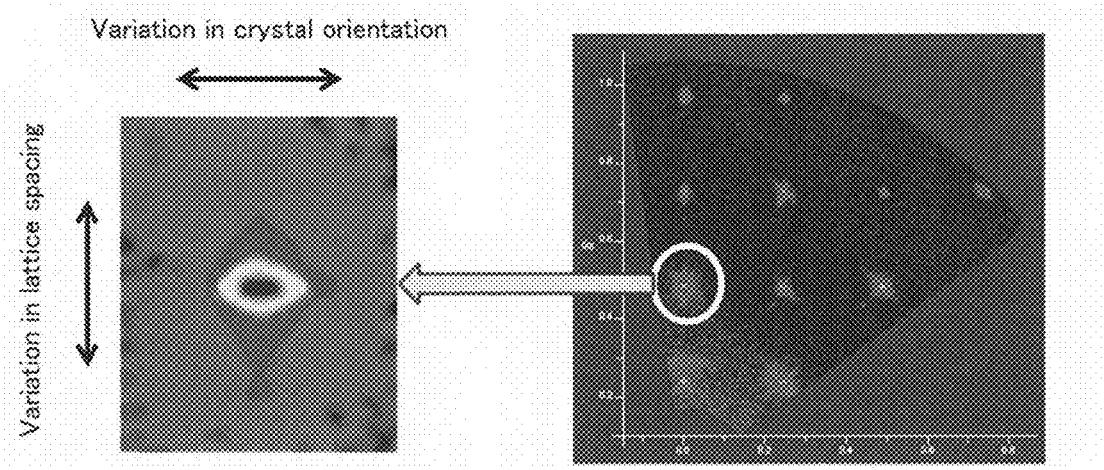
FIG. 62 shows a result of the reciprocal lattice mapping obtained by enlarging 002 part of the Sample 1.

The reciprocal lattice mapping obtained by enlarging the 002 part of the Sample 1 is shown in FIG. 62. Each spot group is regularly arranged, which shows that the PZT thick film has a good single crystallinity.

However, it has been found that all of the spots have a relatively oblong and flat shape when enlarging each of the spots. This shows that all of the PZT columns are single crystal columns, the crystal plane and crystal plane in the direction of thickness are positioned at equal intervals. However, although each of the columns is uniform in xyz, separate columns independently exist, and accordingly, the crystal lattice is easily varied to thereby form a relatively oblong spot.

In this way, as can be found from the present examples, the reciprocal lattice of the present PZT thick film is composed of some relatively oblong spot groups, and the fact proves that the present PZT piezoelectric thick film is composed of an epitaxial growth film having a structure of the single crystal columnar domain group, and the three axes of the x, y, and z axes of every single crystal column are oriented respectively in the same direction.

Figure 63:
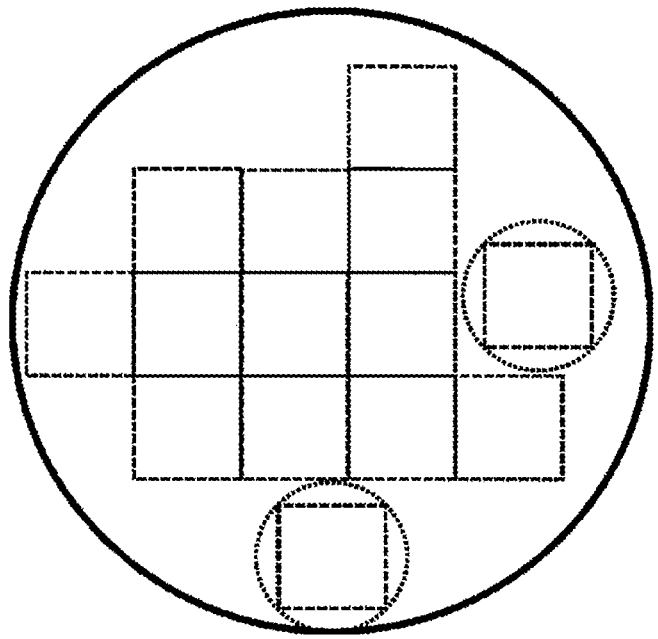
FIG. 63 shows a difference between the present example and a comparative example in the modeling when a wafer is seen from above.
Figure 63:
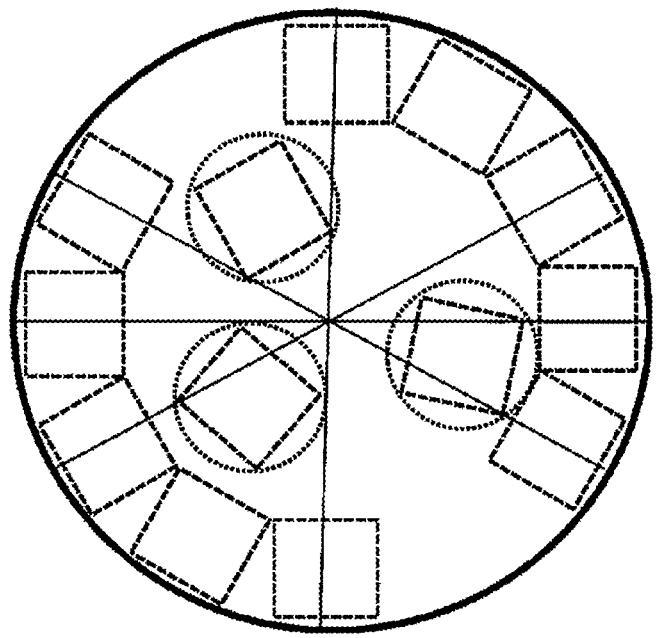

FIG. 63 shows a difference between the present example and the comparative example in the modeling when a wafer is seen from above, and FIG. 63A shows the present example, and FIG. 63B shows the comparative example.

In the present examples, all of the xyz axes of the PZT crystals are uniform in the same respective directions. In the Comparative Examples, the respective PZT crystals are randomly directed. To stretch this point, there are many cases where the crystals are directed to a centrifugal direction. The same also applies to the case of a columnar domain (columnar multi crystal particles). In the present examples, in the all of the PZT columns, the xyz axes are directed to the same respective directions. On the other hand, in the case of the columnar PZT of the Comparative Examples, the respective PZT columns are randomly directed, there is no correlation among the PZT columns.

Figure 64:
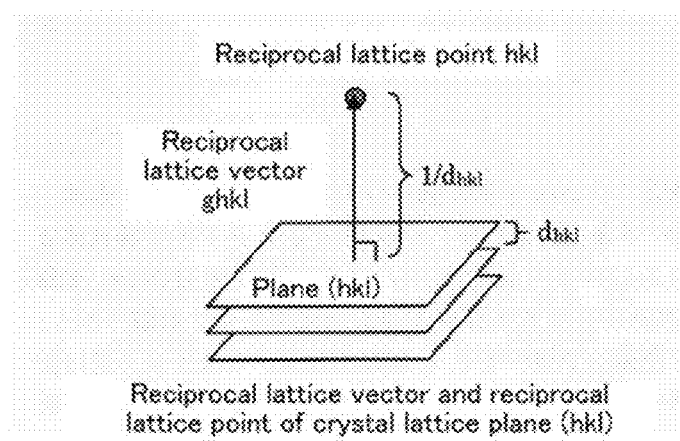
FIG. 64 is a view explaining a theory of the reciprocal lattice mapping.
Figure 64:
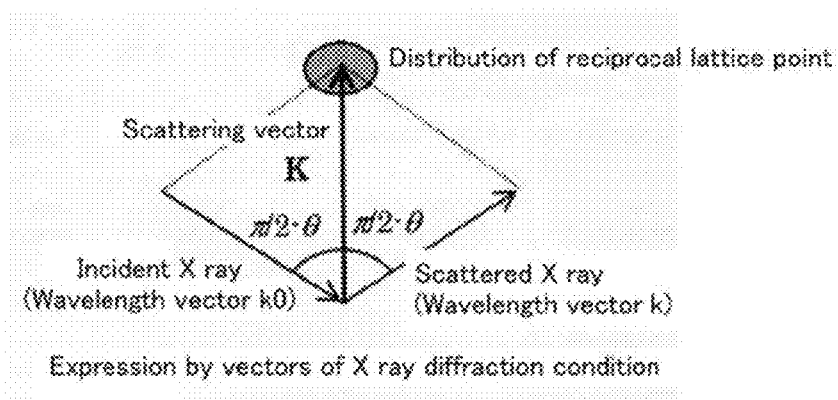
Figure 64:
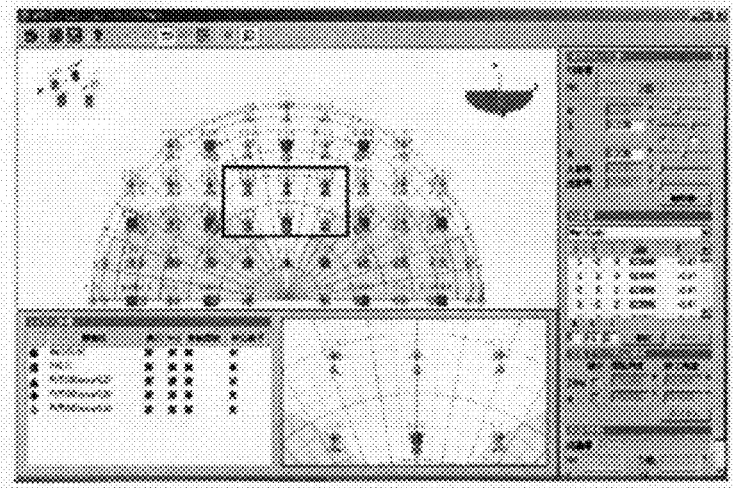

FIG. 64 is a view explaining a theory of the reciprocal lattice mapping. This theory of the reciprocal lattice mapping is disclosed in Non-Patent Document 1.

Figure 65:
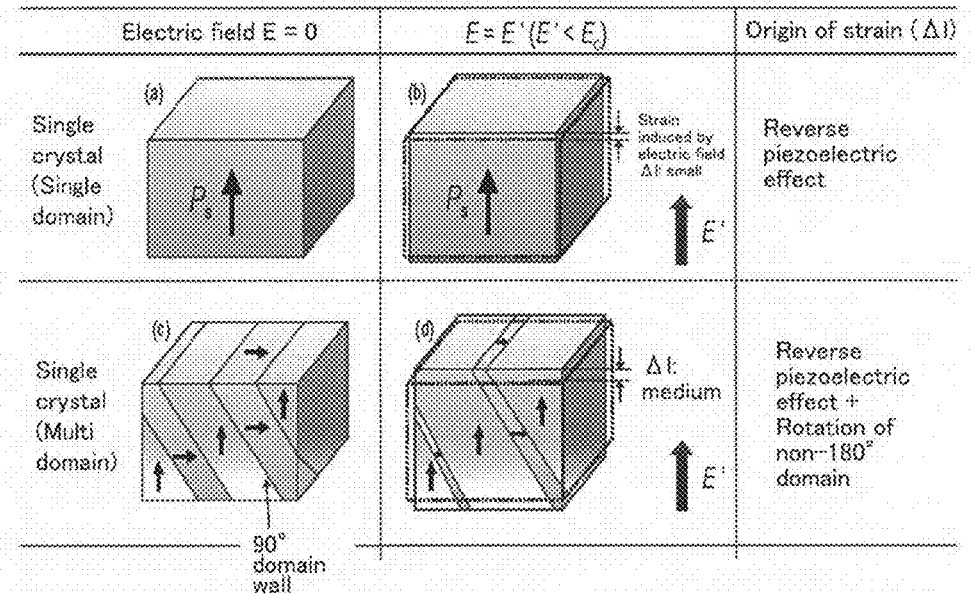
FIG. 65 is a view of an excerpt from a part of the Non-Patent Document 2.

FIG. 65 is a view of an excerpt from a part of the Non-Patent Document 2. As shown in FIG. 1 to FIG. 5, the size of one columnar single crystal becomes small by having a plurality of the columnar single crystals 17a and thus the PbO walls are increased between each of the columnar single crystals. Thereby, it is said that the piezoelectric property can be enhanced.

Figure 66:
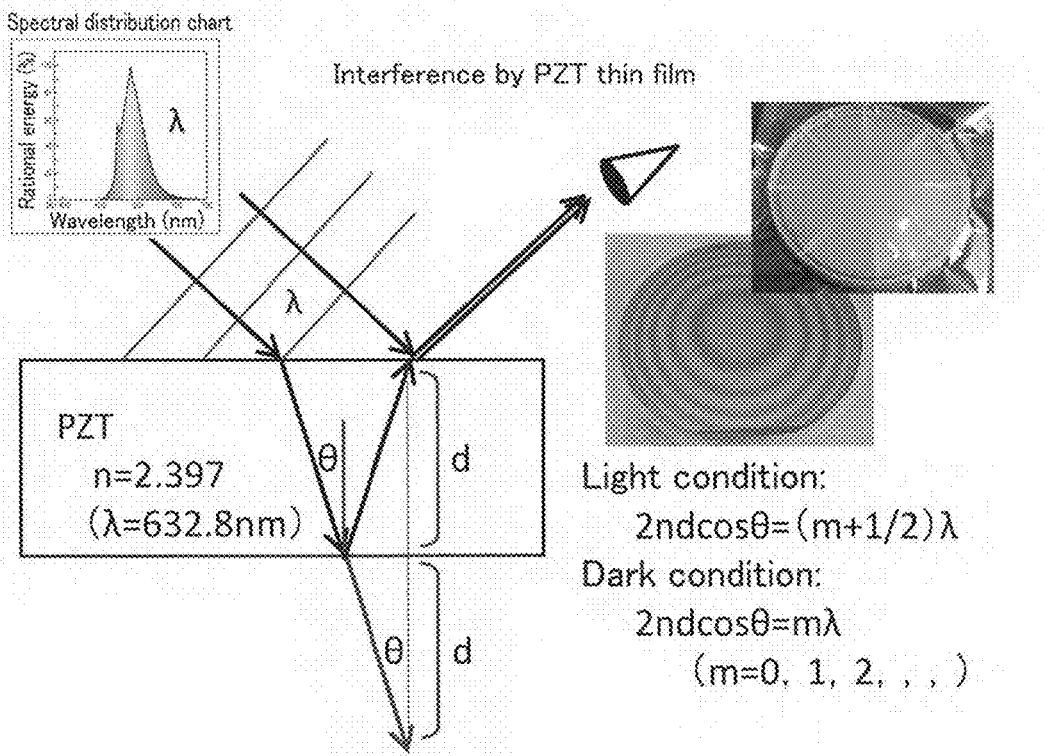
FIG. 66 is a view explaining FIG. 7 in more detail.
Figure 67:
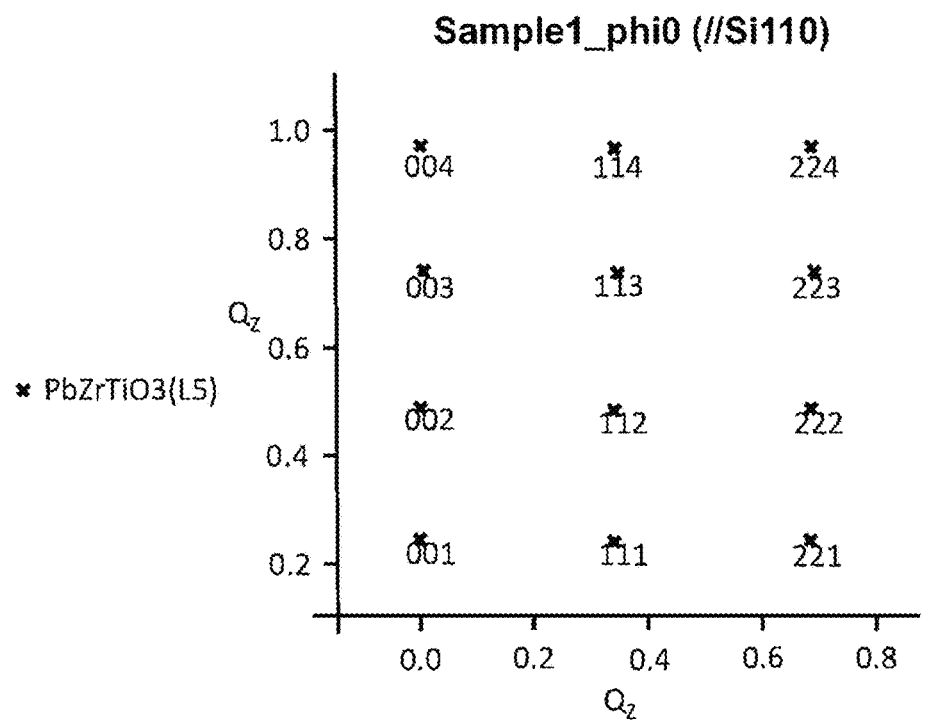
FIG. 67 shows simulation results of the reciprocal lattice of the PZT single crystal.
Figure 68:
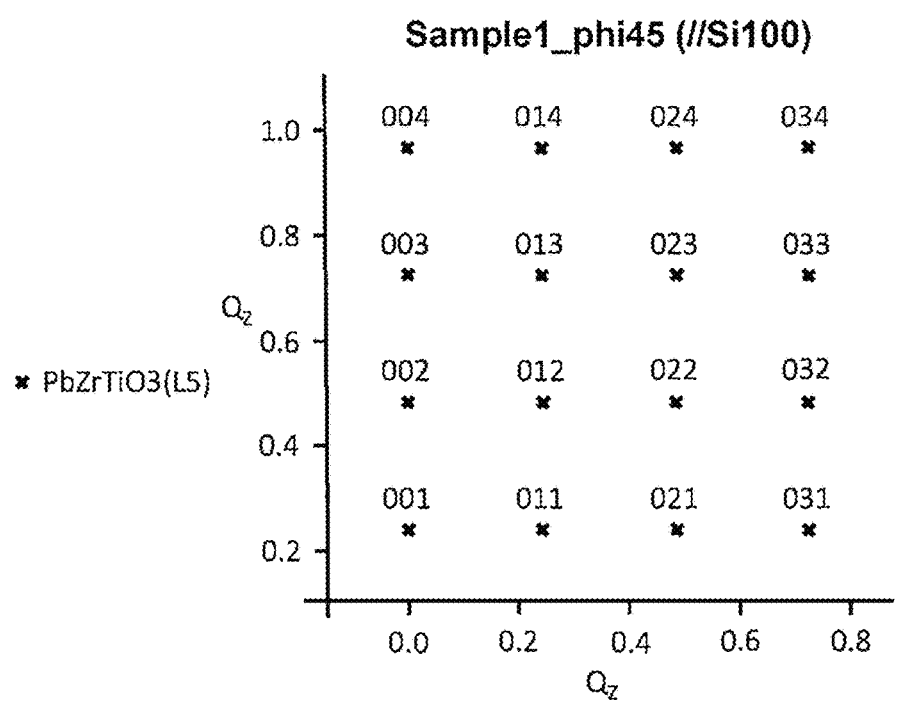
FIG. 68 shows simulation results of the reciprocal lattice of the PZT single crystal.
Figure 69:
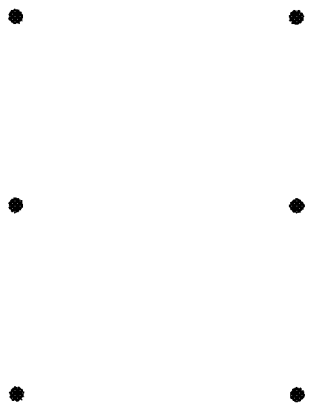
FIG. 69 shows simulation results of the reciprocal lattice of the PZT single crystal.
Figure 70:
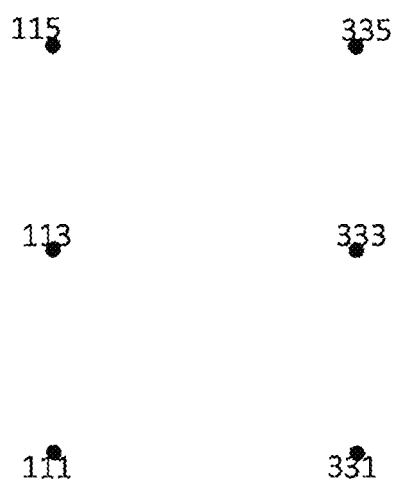
FIG. 70 shows simulation results of the reciprocal lattice of the PZT single crystal.
Figures 71, 72:
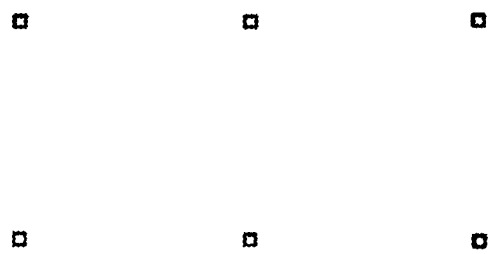
FIG. 71 shows simulation results of the reciprocal lattice of the PZT single crystal.
FIG. 72 shows simulation results of the reciprocal lattice of the PZT single crystal.
Figures 73, 74:
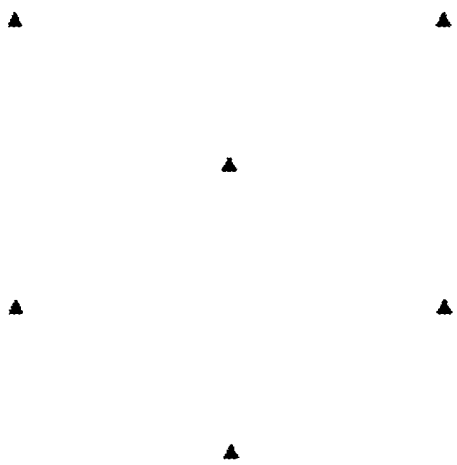
FIG. 73 shows simulation results of the reciprocal lattice of the PZT single crystal.
FIG. 74 shows simulation results of the reciprocal lattice of the PZT single crystal.
Figure 75:
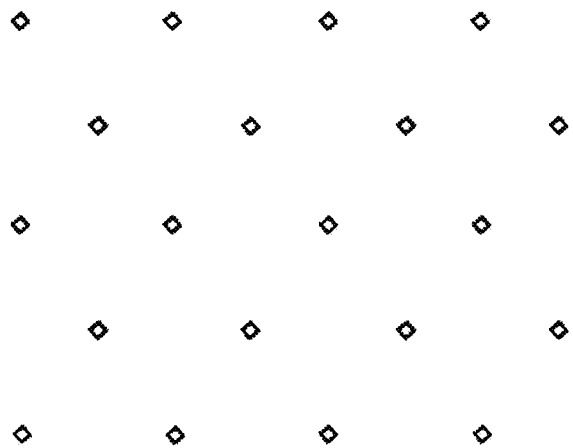
FIG. 75 shows simulation results of the reciprocal lattice of the PZT single crystal.
Figure 76:
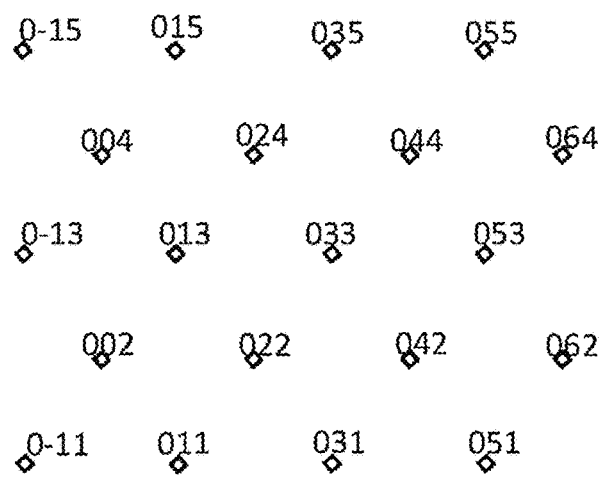
FIG. 76 shows simulation results of the reciprocal lattice of the PZT single crystal.
Figure 77:
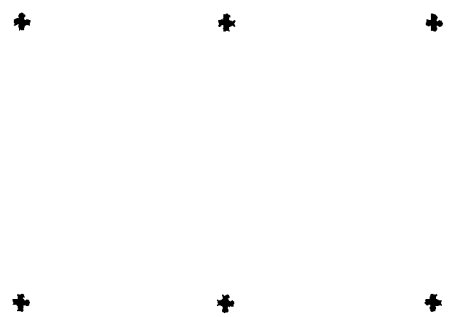
FIG. 77 shows simulation results of the reciprocal lattice of the PZT single crystal.
Figure 78:
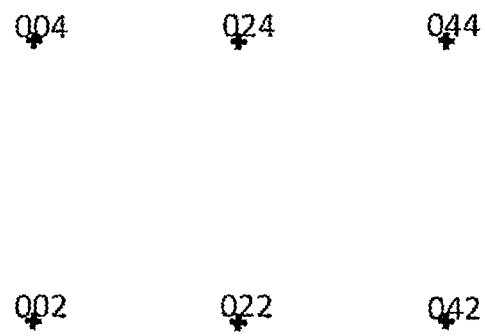
FIG. 78 shows simulation results of the reciprocal lattice of the PZT single crystal.
Figure 79:
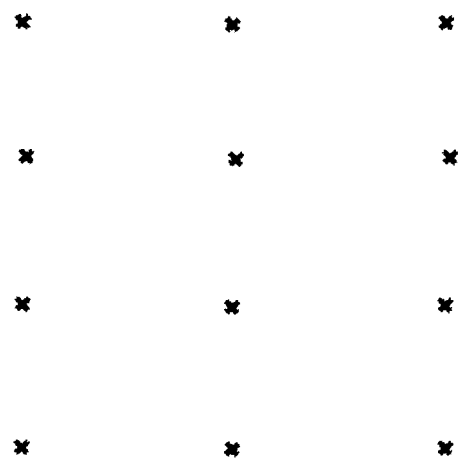
FIG. 79 shows simulation results of the reciprocal lattice of the PZT single crystal.
Figure 80:
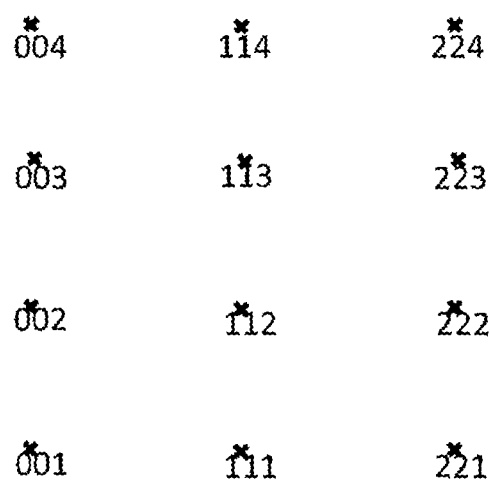
FIG. 80 shows simulation results of the reciprocal lattice of the PZT single crystal.
Figure 81:
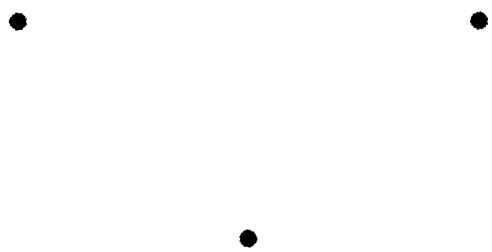
FIG. 81 shows simulation results of the reciprocal lattice of the PZT single crystal.
Figure 82:
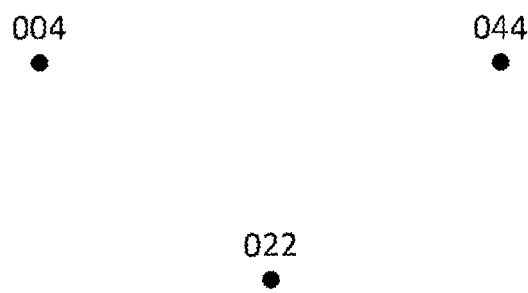
FIG. 82 shows simulation results of the reciprocal lattice of the PZT single crystal.
Figure 83:
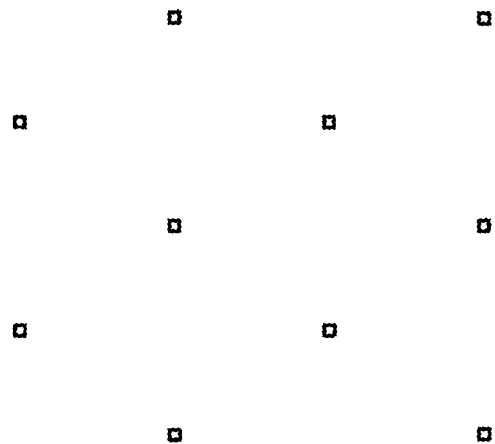
FIG. 83 shows simulation results of the reciprocal lattice of the PZT single crystal.
Figure 84:
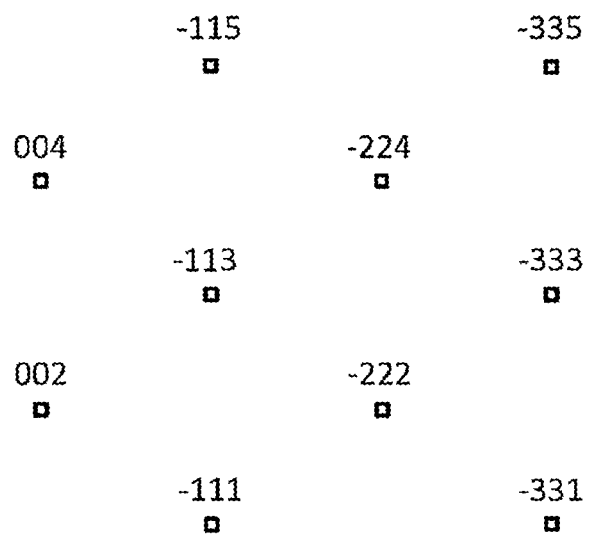
FIG. 84 shows simulation results of the reciprocal lattice of the PZT single crystal.
Figure 85:
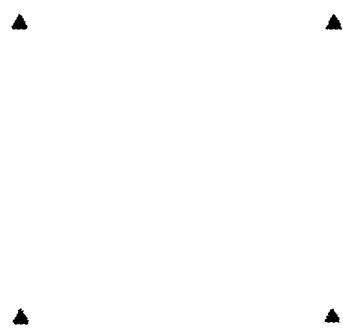
FIG. 85 shows simulation results of the reciprocal lattice of the PZT single crystal.
Figure 86:
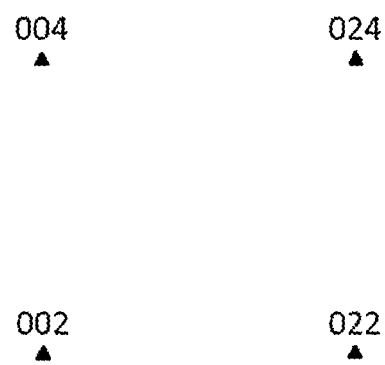
FIG. 86 shows simulation results of the reciprocal lattice of the PZT single crystal.
Figure 87:
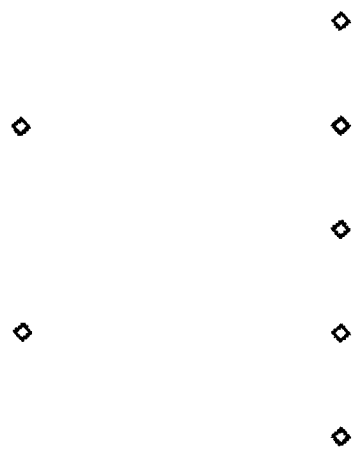
FIG. 87 shows simulation results of the reciprocal lattice of the PZT single crystal.
Figure 88:
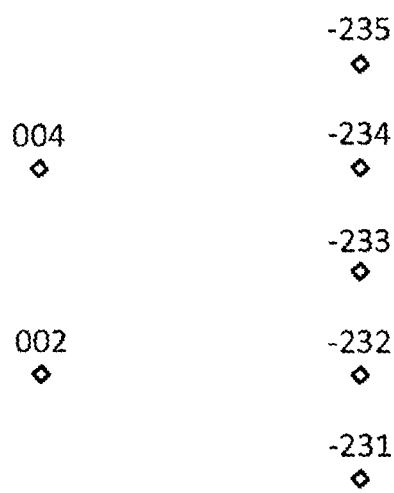
FIG. 88 shows simulation results of the reciprocal lattice of the PZT single crystal.

FIG. 66 is a view explaining FIG. 7 in more detail. The spectral distribution shown in FIG. 66 shows the wavelength region of a fluorescent light. Since sunlight includes lights having wavelengths of wide range, the PZT film was clear as shown in FIG. 7A when observing the PZT film under sunlight, but under the fluorescent light in a clean room, Newton's rings were observed as shown in FIG. 7B by reflecting λ=632.8 nm which is a main wavelength of the fluorescent light.

FIGS. 67 to 92 show simulation results of reciprocal lattice of PZT single crystals. The actually measured results by the reciprocal lattice map measurement shown in FIGS. 18 to 57 completely coincide with simulation results of reciprocal lattice shown in FIGS. 67 to 92, and it has been confirmed that the PZT film is a complete epitaxial film and exhibits crystallinity similar to single crystal.

Figure 93:
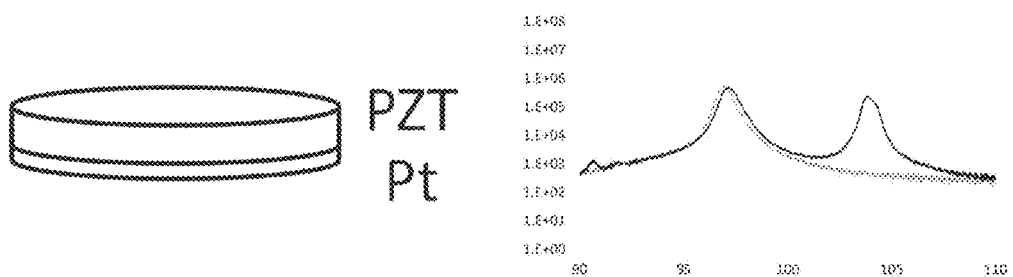
FIG. 93 is an XRD chart of the Sample 5.

FIG. 93 is an XRD (X-Ray Diffraction) chart of the Sample 5. In the XRD chart, the vertical axis represents intensity, and the horizontal axis represents 2θ.

Figure 94:
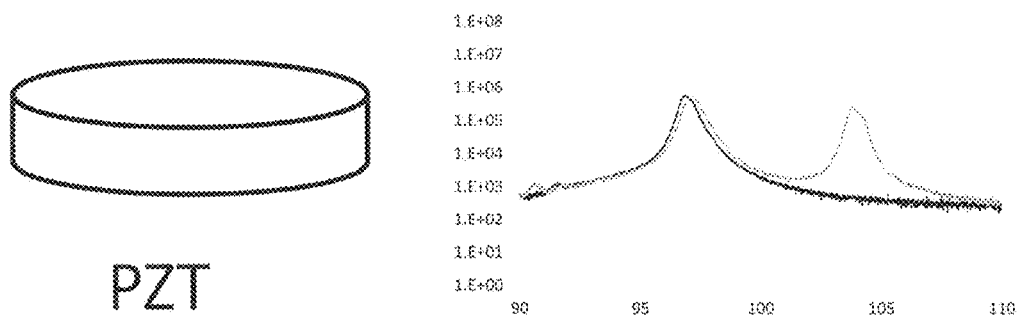
FIG. 94 is an XRD chart of the Sample 6.

FIG. 94 is an XRD chart of the Sample 6. In the XRD chart, the vertical axis represents intensity, and the horizontal axis represents 2θ.

Example 4

First, a SRO(100)/Pt(100) substrate was prepared in the same condition as in Example 1.

Subsequently, a 100 nm PZO was formed by spin coating in the same condition as in Example 1.

Next, crystallization was carried out in O2 at 10 atm under 650° C.-120 sec, after spin-coating a precursor solution of $PbZr_{0.7}Ti_{0.3}O_3$ with a 30% excess Pb concentration at a rotation speed of 3000 rpm for 10 sec and subjecting the resultant substance to hot-plate treatment of 250° C.-30 sec, or 450° C.-60 sec. A 1.5 μm-PZT was produced by repeating this 10 times.

Finally, a 50 nm-PZTCap film was formed by crystallizing in O2 at 10 atm under 650° C.-60 sec, after spin-coating a precursor solution of stoichiometric $PbZr_{0.5}Ti_{0.5}O_3$ at a rotation speed of 5000 rpm for 10 sec and then subjecting the resultant substance to hot-plate treatment of 250° C.-30 sec or 450° C.-60 sec.

Figure 95:
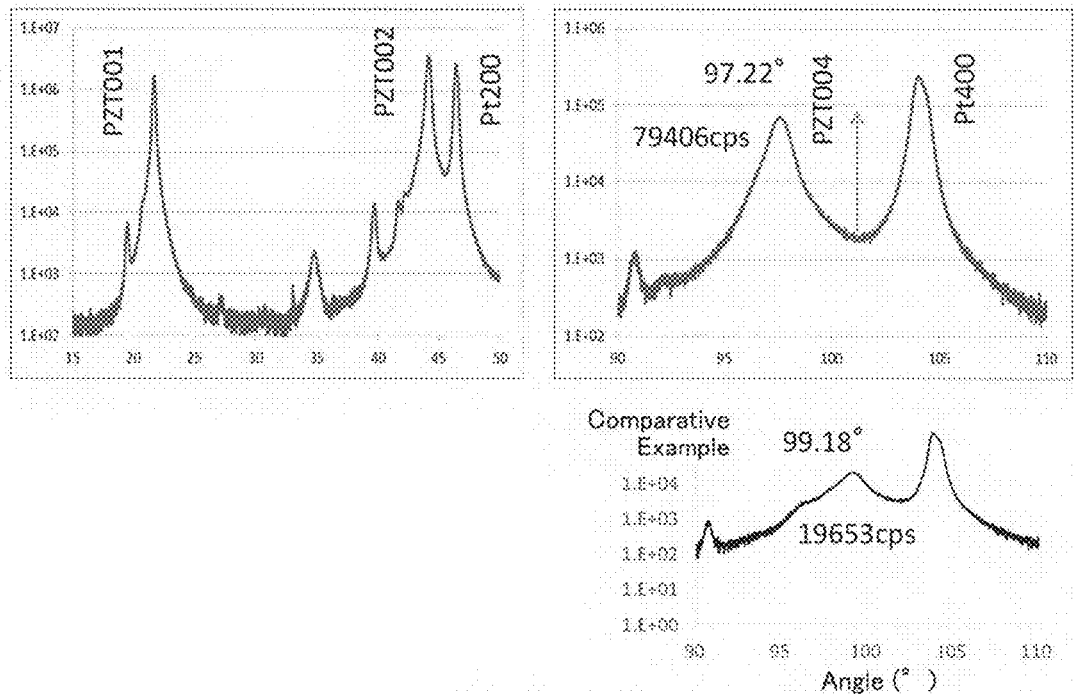
FIG. 95 is an XRD chart of a sample of an Example 4.

From the XRD shown in FIG. 95, it has been found that good crystallinity and good (001) orientation film is formed. Particularly, in comparison with the case of no PZO, the (004) peak intensity is increased by 5 times, and the value of 2θ also exists on 2.04° lower angle side. It was found that, in comparison with the conventional case of no PZO, a length along the c axis is 4.1102 angstroms, namely, a length along the c axis is elongated by 0.063 angstrom from the conventional case (no PZO) in which a length along the c axis is 4.049 angstroms. Not that, in the XRD chart shown in FIG. 95, the vertical axis represents intensity, and the horizontal axis represents 2θ.

Since it is known that the length along the c axis contributes to a large piezoelectric property, it has been able to be predicted that the spin coated film according to the present example exhibits a very large piezoelectric property.

Figure 96:
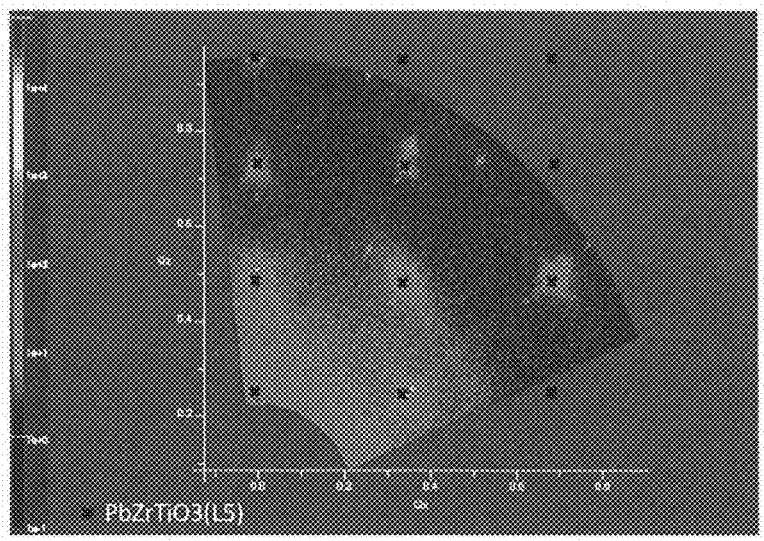
FIG. 96 shows a result of a wide reciprocal lattice mapping of the sample of the Example 4.

Furthermore, the results of the wide reciprocal lattice mapping shown in FIG. 96 shows that, although the spot size is slightly larger than the case of the sputtering body, a good single crystallinity is exhibited.

EXPLANATION OF SYMBOLS

11 Si substrate
12 $ZrO_2$ film
13 Pt film
14 $SrRuO_3$ (SRO) film
15 $PbZrO_3$ film (PZO film)
16a, 16b PbO wall
17 PZT film ($Pb(Zr_{1-x}Ti_x)O_3$ film)
17a Columnar single crystal
17x x axis
17y y axis
17z z axis
18 PZTCap film ($Pb(Zr_{1-y}Ti_y)O_3$ film)

The invention claimed is:

1. A ferroelectric ceramic comprising a $Pb(Zr_{1-x}Ti_x)O_3$ film, wherein:
   x satisfies the following formula 1, $0<x<1$     formula 1, the $Pb(Zr_{1-x}Ti_x)O_3$ film comprises a plurality of columnar single crystals and a PbO wall is formed around each of the plurality of columnar single crystals, and
   an x axis, a y axis and a z axis of each of the plurality of columnar single crystals are oriented in a same direction, respectively.

2. The ferroelectric ceramic according to claim 1, wherein:
   the $Pb(Zr_{1-x}Ti_x)O_3$ film is formed on a $Pb(Zr_{1-A}Ti_A)O_3$ film,
   the A and x satisfy the following formula 2 and formula 3, $0 \leq A \leq 0.1$     formula 2

$A<x$     formula 3.

3. The ferroelectric ceramic according to claim 1, wherein a plane z of the z axis has a plane (001).

4. The ferroelectric ceramic according to claim 1, wherein the $Pb(Zr_{1-x}Ti_x)O_3$ film has a ratio of elements of $Pb:(Zr_{1-x}+Ti_x)$ of (1.4 to 1.1):1.

5. The ferroelectric ceramic according to claim 1, wherein the $Pb(Zr_{1-A}Ti_A)O_3$ film has a ratio of elements of $Pb:(Zr_{1-A}+Ti_A)$ of (1.4 to 1.1):1.

6. The ferroelectric ceramic according to claim 1, wherein:
a $Pb(Zr_{1-y}Ti_y)O_3$ film is formed on the $Pb(Zr_{1-x}Ti_x)O_3$ film, and
the $Pb(Zr_{1-y}Ti_y)O_3$ film has a ratio of elements of $Pb:(Zr_{1-y}+Ti_y)$ of (1.05 to 1):1, and
the y satisfies the following formula 4, $0<y<1$ formula 4.

7. The ferroelectric ceramic according to claim 6, wherein the ratio of elements of $Pb:(Zr_{1-y}+Ti_y)$ is 1:1.

8. The ferroelectric ceramic according to claim 1, wherein:
the A is 0, and
the $Pb(Zr_{1-A}Ti_A)O_3$ is a $PbZrO_3$ film.

9. The ferroelectric ceramic according to claim 1, wherein the $Pb(Zr_{1-A}Ti_A)O_3$ film is formed on an oxide film.

10. The ferroelectric ceramic according to claim 9, wherein the oxide film is an $SrRuO_3(SRO)$ film or an $Sr(Ti,Ru)O_3$ film.

11. The ferroelectric ceramic according to claim 1, wherein the $Pb(Zr_{1-A}Ti_A)O_3$ film is formed on an electrode film.

12. The ferroelectric ceramic according to claim 11, wherein the electrode film is made of an oxide or a metal.

13. The ferroelectric ceramic according to claim 11, wherein the electrode film is a Pt film or an Ir film.

14. The ferroelectric ceramic according to claim 11, wherein the electrode film is formed on a $ZrO_2$ film.

15. The ferroelectric ceramic according to claim 11, wherein the electrode film is formed on a Si substrate.

16. A method for manufacturing a ferroelectric ceramic comprising the steps of:
forming, on a substrate, a $Pb(Zr_{1-A}Ti_A)O_3$ film comprising a plurality of columnar single crystals and a PbO wall formed around each of the plurality of columnar single crystals by coating, onto the substrate, a precursor solution for forming the $Pb(Zr_{1-A}Ti_A)O_3$ film to which Pb is excessively added by 10 atomic % or more to 40 atomic % or less, and by performing crystallization under a pressurized oxygen atmosphere, and
forming, on the $Pb(Zr_{1-A}Ti_A)O_3$ film, a $Pb(Zr_{1-x}Ti_x)O_3$ film comprising a plurality of columnar single crystals and a PbO wall formed around each of the plurality of columnar single crystals by sputtering a sputtering target for the $Pb(Zr_{1-x}Ti_x)O_3$ having a ratio of elements of $Pb:(Zr_{1-x}+Ti_x)$ of (1.4 to 1.1):1, wherein
A and x satisfy the following formulas 1 to 3, $0<x<1$ formula 1

$0 \leq A \leq 0.1$ formula 2

$A<x$ formula 3.

17. A method for manufacturing a ferroelectric ceramic comprising the steps of:
forming, on a substrate, a $Pb(Zr_{1-A}Ti_A)O_3$ film comprising a plurality of columnar single crystals and a PbO wall formed around each of the plurality of columnar single crystals by coating, onto the substrate, a precursor solution for forming the $Pb(Zr_{1-A}Ti_A)O_3$ film to which Pb is excessively added by 10 atomic % or more to 40 atomic % or less, and by performing crystallization under a pressurized oxygen atmosphere, and
forming, on the $Pb(Zr_{1-A}Ti_A)O_3$ film, a $Pb(Zr_{1-x}Ti_x)O_3$ film comprising a plurality of columnar single crystals and a PbO wall formed around each of the plurality of columnar single crystals by coating, onto the $Pb(Zr_{1-A}Ti_A)O_3$ film, a precursor solution for forming the $Pb(Zr_{1-x}Ti_x)O_3$ film to which Pb is excessively added by 10 atomic % or more to 40 atomic % or less, and by performing crystallization under a pressurized oxygen atmosphere, wherein
A and x satisfy the following formulas 1 to 3, $0<x<1$ formula 1

$0 \leq A \leq 0.1$ formula 2

$A<x$ formula 3.

18. The method for manufacturing the ferroelectric ceramic according to claim 16, further comprising the step of: after the step of forming the $Pb(Zr_{1-x}Ti_x)O_3$ film, forming a $Pb(Zr_{1-y}Ti_y)O_3$ film on the $Pb(Zr_{1-x}Ti_x)O_3$ film by coating, onto the $Pb(Zr_{1-x}Ti_x)O_3$ film, a precursor solution for forming the $Pb(Zr_{1-y}Ti_y)O_3$ film to which Pb is excessively added by 0 atomic % or more to 5 atomic % or less, and by performing crystallization under a pressurized oxygen atmosphere, wherein
the y satisfies the following formula 4, $0<y<1$ formula 4.

19. The method for manufacturing the ferroelectric ceramic according to claim 18, wherein a ratio of elements of the $Pb:(Zr_{1-y}+Ti_y)O_3$ is 1:1.

20. The method for manufacturing the ferroelectric ceramic according to claim 16, wherein:
the A is 0, and
the $Pb(Zr_{1-A}Ti_A)O_3$ is a $PbZrO_3$ film.

* * * * *